United States Patent
Mase et al.

(10) Patent No.: US 9,053,998 B2
(45) Date of Patent: Jun. 9, 2015

(54) RANGE SENSOR AND RANGE IMAGE SENSOR

(75) Inventors: Mitsuhito Mase, Hamamatsu (JP); Takashi Suzuki, Hamamatsu (JP); Jun Hiramitsu, Hamamatsu (JP)

(73) Assignee: HAMAMATSU PHOTONICS K.K., Hamamatsu-shi, Shizuoka (JP)

(*) Notice: Subject to any disclaimer, the term of this patent is extended or adjusted under 35 U.S.C. 154(b) by 0 days.

(21) Appl. No.: 13/415,966

(22) Filed: Mar. 9, 2012

(65) Prior Publication Data
US 2013/0228828 A1 Sep. 5, 2013

(30) Foreign Application Priority Data

Mar. 2, 2012 (JP) ................................. 2012-046844

(51) Int. Cl.
*H01L 27/148* (2006.01)
*H01L 27/146* (2006.01)
*G01S 17/89* (2006.01)
*G01S 17/10* (2006.01)
*G01S 7/486* (2006.01)

(52) U.S. Cl.
CPC ........... *H01L 27/14607* (2013.01); *G01S 17/89* (2013.01); *G01S 17/10* (2013.01); *G01S 7/4863* (2013.01); *H01L 27/1461* (2013.01); *H01L 27/14612* (2013.01)

(58) Field of Classification Search
CPC .................... H01L 27/14672; H01L 27/14607
USPC ........................................................ 257/223
See application file for complete search history.

(56) References Cited

U.S. PATENT DOCUMENTS 7,119,350 B2 * 10/2006 Hashimoto et al. ...... 250/559.38
2010/0039546 A1 2/2010 Cohen et al.
(Continued)

FOREIGN PATENT DOCUMENTS

JP 2009-276243 11/2009
JP 2011-112382 6/2011
(Continued)

OTHER PUBLICATIONS

T.Y. Lee et al., "A 192x108 pixel ToF-3D image sensor with single-tap concentric-gate demodulation pixels in 0.13 μm technology," In Proceedings of the 2011 IEEE International Electron Devices Meeting, Washington, DC (USA), Dec. 5-8, 2011, pp. 8.7.1-8.7.4.
(Continued)

*Primary Examiner* — Colleen A Matthews
*Assistant Examiner* — Christopher Johnson
(74) *Attorney, Agent, or Firm* — Drinker Biddle & Reath LLP

(57) ABSTRACT

A range sensor includes a charge generating region, a signal charge collecting region, an unnecessary charge collecting region, a photogate electrode, a transfer electrode, and an unnecessary charge collecting gate electrode. Outer peripheries of the charge generating region extend to sides of a polygonal pixel region except for corner portions thereof. The signal charge collecting region is disposed at a center portion of the pixel region and inside the charge generating region so as to be surrounded by the charge generating region. The unnecessary charge collecting region is disposed in the corner portion of the pixel region and outside the charge generating region. The photogate electrode is disposed on the charge generating region. The transfer electrode is disposed between the signal charge collecting region and the charge generating region. The unnecessary charge collecting gate electrode is disposed between the unnecessary charge collecting region and the charge generating region.

9 Claims, 17 Drawing Sheets

(56) References Cited

U.S. PATENT DOCUMENTS

| | | |
|---|---|---|
| 2011/0141452 A1* | 6/2011 | Mase et al. .................. 356/4.01 |
| 2012/0038904 A1* | 2/2012 | Fossum et al. ............... 356/5.09 |
| 2013/0258311 A1 | 10/2013 | Mase et al. |

FOREIGN PATENT DOCUMENTS

| | | |
|---|---|---|
| JP | 2011-112614 | 6/2011 |
| JP | 2011-133464 | 7/2011 |
| JP | 2011-179926 | 9/2011 |
| WO | WO2009/139312 | * 11/2009 |

OTHER PUBLICATIONS

U.S. Office Action dated Jan. 31, 2014 that issued in U.S. Appl. No. 13/431,136 including Double Patenting Rejections on pp. 2-5.
International Preliminary Report on Patentability and written opinion issued Sep. 12, 2014 in International Application No. PCT/JP2012/079415.

* cited by examiner

RANGE SENSOR AND RANGE IMAGE SENSOR

BACKGROUND OF THE INVENTION

1. Field of the Invention

The present invention relates to a range sensor and a range image sensor.

2. Related Background Art

A TOF (Time-Of-Flight)-type range image sensor (range sensor) is known (see, for example, T. Y. Lee et al., "A 192× 108 pixel ToF-3D image sensor with single-tap concentric-gate demodulation pixels in 0.13 μm technology," Proceedings of the 2011 IEEE International Electron Devices Meeting, Dec. 5-8, 2011, pp. 8.7.1-8.7.4). The range image sensor described in this literature includes a charge generating region configured to generate charges in response to incident light, a charge collecting region disposed inside the charge generating region so as to be surrounded by the charge generating region, a charge discharging region disposed outside the charge generating region so as to surrounds the charge generating region, an inside gate electrode disposed on the charge generating region and configured to cause charges to flow from the charge generating region into the charge collecting region in response to an input signal, and an outside discharge gate electrode disposed on the charge generating region and configured to cause charges from the charge generating region into the charge discharging region in response to an input signal. The charge collecting region is disposed at the center portion of the polygonal pixel region, and the charge discharging region is disposed around the entire pixel region. Because of a potential difference applied between the inside gate electrode and the outside discharge gate electrode, a potential gradient is formed across regions immediately below the inside gate electrode and the outside discharge gate electrode. Because of this potential gradient, charges generated in the charge generating region migrate to the charge collecting region or charge discharging region.

SUMMARY OF THE INVENTION

However, the range image sensor described in the literature has the following problem.

Since the charge discharging region located outside the charge generating region is disposed around the entire polygonal pixel region, the area of the charge generating region must be narrowed. Accordingly, an aperture ratio, which is the area of the charge generating region to the ratio of the area of the pixel region, is low.

When the charge generating region is enlarged to the end of the pixel region, the aperture ratio is high, but the charge discharging region cannot be disposed. Since a charge transfer time is proportional to the distance the charges migrate, the distance charges generated near the corner portion of the pixel region in the charge generating region migrate to the charge collecting region is long and the transfer time is also long. As a result, an efficiency of the transfer of charges to the charge collecting region is poor.

An object of the present invention is to provide a range sensor and a range image sensor which are capable of improving the aperture ratio and the efficiency of the charge transfer.

In an aspect, the present invention is a range sensor comprising: a charge generating region configured such that outer peripheries thereof extend to sides of a polygonal pixel region except for corner portions of the pixel region, and configured to generate charges in response to incident light; a signal charge collecting region disposed at a center portion of the pixel region and inside the charge generating region so as to be surrounded by the charge generating region, and configured to collect the signal charges from the charge generating region; an unnecessary charge collecting region disposed in the corner portion of the pixel region and outside the charge generating region, and configured to collect unnecessary charges from the charge generating region; a photogate electrode disposed on the charge generating region; a transfer electrode disposed between the signal charge collecting region and the charge generating region, and configured to cause the signal charges from the charge generating region to flow into the signal charge collecting region in response to an input signal; and an unnecessary charge collecting gate electrode disposed between the unnecessary charge collecting region and the charge generating region, and configured to cause the unnecessary charges from the charge generating region to flow into the unnecessary charge collecting region in response to an input signal.

In the present invention, the outer peripheries of the charge generating region are extended to the sides of the pixel region except for the corner portions of the polygonal pixel region, and the area of the charge generating region is enlarged. This enables the aperture ratio to be improved.

Meanwhile, when the charge generating region is extended to the corner portions of the pixel region, the distance charges generated in regions corresponding to the corner portions of the pixel region in the charge generating region migrate to the signal charge collecting region located at the center portion of the pixel region is long. For this reason, the transfer time of the charges, generated in regions corresponding to the corner portions, to the signal charge collecting region is increased, and therefore the efficiency of the transfer of signal charges to the charge collecting region is deteriorated. In contrast to this, in the present invention, the charge generating region is not disposed in the corner portions of the pixel region, as described above, and therefore signal charges are not transferred from a region which causes the distance the charges migrate to be longer. For this reason, the efficiency of the transfer of signal charges to the charge collecting region is improved.

In the present invention, the unnecessary charge collecting region is disposed in the corner portion of the pixel region where the charge generating region is not disposed. For this reason, the unnecessary charge collecting region can be disposed without deteriorating the improvement of the aperture ratio and the efficiency of the charge transfer.

The range sensor may include a plurality of the adjacent pixel regions, the charge generating regions of the plurality of pixel regions may be integrated with each other, and the photogate electrodes of the plurality of pixel regions may be integrated with each other. The unnecessary charge collecting regions of the plurality of pixel regions may be integrated with each other. In either case, the usage efficiency of the sensor area can be improved. As a result, space resolution can be improved.

The transfer electrodes of the plurality of pixel regions may be supplied respective charge transfer signals having different phases. In this case, the distance is calculated based on outputs from a plurality of the adjacent pixel regions.

The transfer electrode may be supplied a transfer signal which is intermittently given a phase shift at a predetermined timing. In this case, the distance is calculated based on outputs from one pixel region. For this reason, this configuration can reduce the deviation in the calculation of the distance compared to a configuration in which the distance is calculated based on outputs from a plurality of pixel regions. Furthermore, the usage efficiency of the sensor area can be increased, and space resolution can be improved.

A region where a readout circuit for reading out a signal corresponding to a charge quantity accumulated in the signal charge collecting region is arranged may be located along one side of the pixel region and outside the pixel region. A region where a readout circuit for reading out a signal corresponding to a charge quantity accumulated in the signal charge collecting region is arranged may be located in one corner portion of the pixel region. In either case, the readout circuit can be disposed without deteriorating the improvement of the aperture ratio and the efficiency of the charge transfer.

The signal charge collecting region may be rectangular-shaped when viewed in a plan view, and the transfer electrode may be approximately polygonal loop-shaped.

In another aspect, the present invention is a range image sensor which comprises an imaging region including a plurality of units disposed in a one-dimensional or two-dimensional arrangement on a semiconductor substrate and which obtains a range image based on charge quantities output from the units, wherein each of the units is the aforementioned range sensor.

According to the present invention, the aperture ratio and the efficiency of the charge transfer can be improved, as described above.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

The preferred embodiments of the present invention will be described below in detail with reference to the accompanying drawings. In the description, the same elements or elements with the same functionality will be denoted by the same reference signs, without redundant description.

Figure 1:
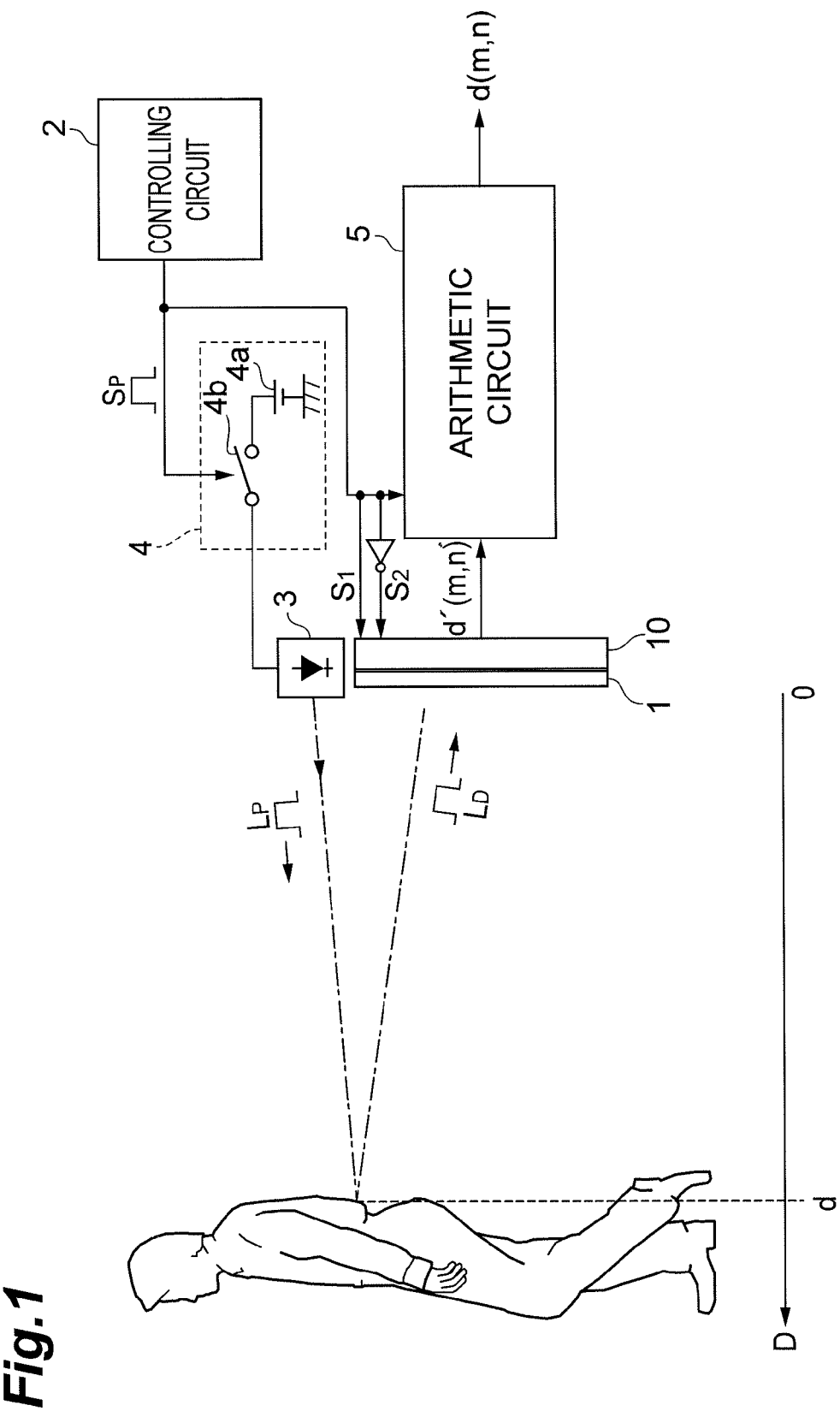
FIG. 1 is an explanatory diagram illustrating a configuration of a distance measuring device according to the present embodiment.

FIG. 1 is an explanatory diagram showing a configuration of a distance measuring device.

This distance measuring device is provided with a range image sensor 1, a light source 3 configured to emit near-infrared light, a driving circuit 4, a controlling circuit 2, and an arithmetic circuit 5. The driving circuit 4 provides a pulse drive signal Sp to the light source 3. The controlling circuit 2 provides detection gate signals $S_1$, $S_2$ synchronized with the pulse drive signal $S_P$ to first and second gate electrodes (TX1, TX2: cf. FIG. 4) included in each pixel of the range image sensor 1. The arithmetic circuit 5 calculates a distance to an object H, such as a pedestrian or the like, based on a signal d'(m, n) indicative of distance information read out from the first and second semiconductor regions (FD1-FD2: cf. FIG. 4) of the range image sensor 1. The distance from the range image sensor 1 to the object H in a horizontal direction D is set to d. The controlling circuit 2 also outputs a charge transfer signal S3 described below.

The controlling circuit 2 inputs a pulse drive signal Sp to the switch 4b of the driving circuit 4. The light source 3 for projection of light including an LED or a laser diode is connected to a power source 4a via the switch 4b. When the pulse drive signal $S_P$ is input to the switch 4b, a drive current having the same waveform as the pulse drive signal $S_P$ is supplied to the light source 3, and the light source 3 outputs pulsed light $L_P$ as probe light for distance measurement. When the pulse light $L_P$ is irradiated onto the object H, the pulse light is reflected from the object H. The reflected pulse light is incident as pulse light $L_D$ into the range image sensor 1, and a pulse detection signal $S_D$ is output.

The range image sensor 1 is disposed on a wiring board 10. The signal d'(m, n) including distance information is output from each pixel of the range image sensor 1 via wiring of the wiring board 10.

The waveform of the pulse drive signal $S_P$ is a rectangular wave having period T. Assuming that a high level is "1" and a low level is "0," the voltage V(t) thereof is given as the following equations:
Pulse drive signal $S_P$:

$$V(t)=1 \text{ (in the case of } 0<t<(T/2));$$

$$V(t)=0 \text{ (in the case of } (T/2)<t<T);$$

$$V(t+T)=V(t).$$

The waveforms of the detection gate signals $S_1$, $S_2$ are rectangular waves having period T. The voltages V(t) thereof are given as the following equations:

Detection gate signal $S_1$:

$V(t)=1$ (in the case of $0<t<(T/2)$);

$V(t)=0$ (in the case of $(T/2)<t<T$);

$V(t+T)=V(t)$.

Detection gate signal $S_2$ (=inversion of $S_1$):

$V(t)=0$ (in the case of $0<t<(T/2)$);

$V(t)=1$ (in the case of $(T/2)<t<T$);

$V(t+T)=V(t)$.

The foregoing pulse signals $S_P$, $S_1$, $S_2$, $S_D$ all have pulse period ($2\times T_P$). Let Q1 be a charge quantity generated in the range image sensor 1 with the detection gate signal $S_1$ and the pulse detection signal $S_D$ both being "1," and Q2 be a charge quantity generated in the range image sensor 1 with the detection gate signal $S_2$ and the pulse detection signal $S_D$ both being "1."

A phase difference between the detection gate signal $S_1$ and the pulse detection signal $S_D$ is proportional to the charge quantity Q2 generated in the range image sensor 1 in an overlap duration in which the detection gate signal $S_2$ and the pulse detection signal $S_D$ are "1." That is, the charge quantity Q2 is a charge quantity which is generated in the duration in which the logical AND of the detection gate signal $S_2$ and the pulse detection signal $S_D$ is "1." When a total charge quantity generated within a single pixel is Q1+Q2 and the half-period pulse width of the pulse drive signal $S_P$ is $T_P$, the pulse detection signal $S_D$ lags behind the pulse drive signal $S_P$ by $\Delta t = T_P \times Q2/(Q1+Q2)$. The time of flight $\Delta t$ of one light pulse is given by $\Delta t = 2d/c$, where d is the distance to the object and c the speed of light. For this reason, when the two charge quantities (Q1, Q2) are output as a signal d'(m, n) having the distance information from a specific pixel, the arithmetic circuit 5 calculates the distance $d=(c\times\Delta t)/2=c\times T_P \times Q2/(2\times(Q1+Q2))$ to the object H, based on the input charge quantities Q1, Q2 and the predetermined half-period pulse width $T_P$.

As described above, the arithmetic circuit 5 can calculate the distance d by separately reading out the charge quantities Q1, Q2. The foregoing pulses are repeatedly emitted and integral values thereof can be output as respective charge quantities Q1, Q2.

The ratios of the charge quantity Q1 and Q2 to the total charge quantity correspond to the above-described phase difference, that is, the distance to the object H. The arithmetic circuit 5 calculates the distance to the object H based on the phase difference. As described above, when the time difference corresponding to the phase difference is set to $\Delta t$, the distance d is preferably given by $d=(c\times\Delta t)/2$, but an appropriate correction operation may be performed in addition thereto. For example, if an actual distance is different from the calculated distance d, a factor $\beta$ to correct the latter is preliminarily obtained and the finally calculated distance d is obtained by multiplying the factor $\beta$ to the calculated distance d in a product after shipped. Another available correction is such that an ambient temperature is measured, an operation to correct the speed of light c is performed if the speed of light c differs depending upon the ambient temperature, and then the distance calculation is performed. It is also possible to preliminarily store in a memory a relation between signals input into the arithmetic circuit and actual distances, and determine the distance by a lookup table method. The calculation method can be modified depending upon the sensor structure and the conventionally known calculation methods can be applied thereto.

Figure 2:
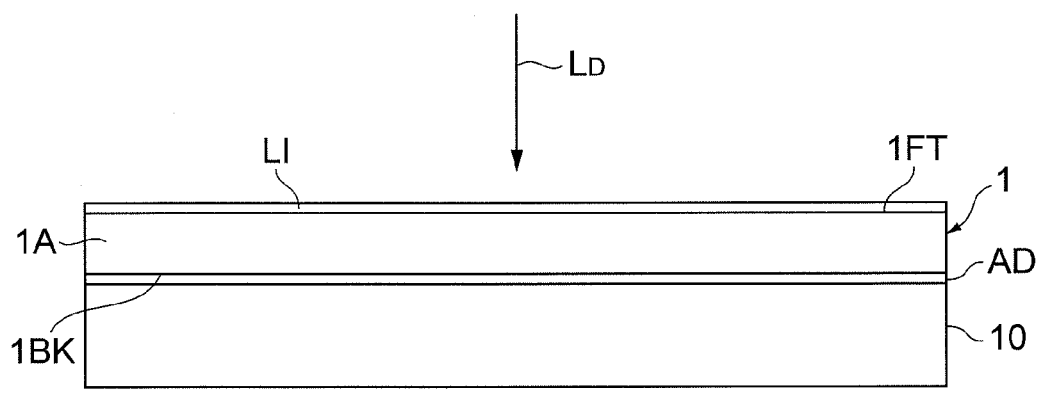
FIG. 2 is a diagram for explaining a cross-sectional configuration of a range image sensor.

FIG. 2 is a diagram for explaining a cross-sectional configuration of the range image sensor.

The range image sensor 1 is a front-illuminated type range image sensor, and has a semiconductor substrate 1A. Pulse light $L_D$ is incident through a light incident surface 1FT into the range image sensor 1. A back surface 1BK of the range image sensor 1 opposite the light incident surface 1FT is connected through an adhesive region AD to the wiring board 10. The adhesive region AD includes an insulating adhesive and a filler. The range image sensor 1 includes a light-shielding layer LI having an opening at a predetermined location. The light-shielding layer LI is disposed on the front of the light incident surface 1FT.

Figure 3:
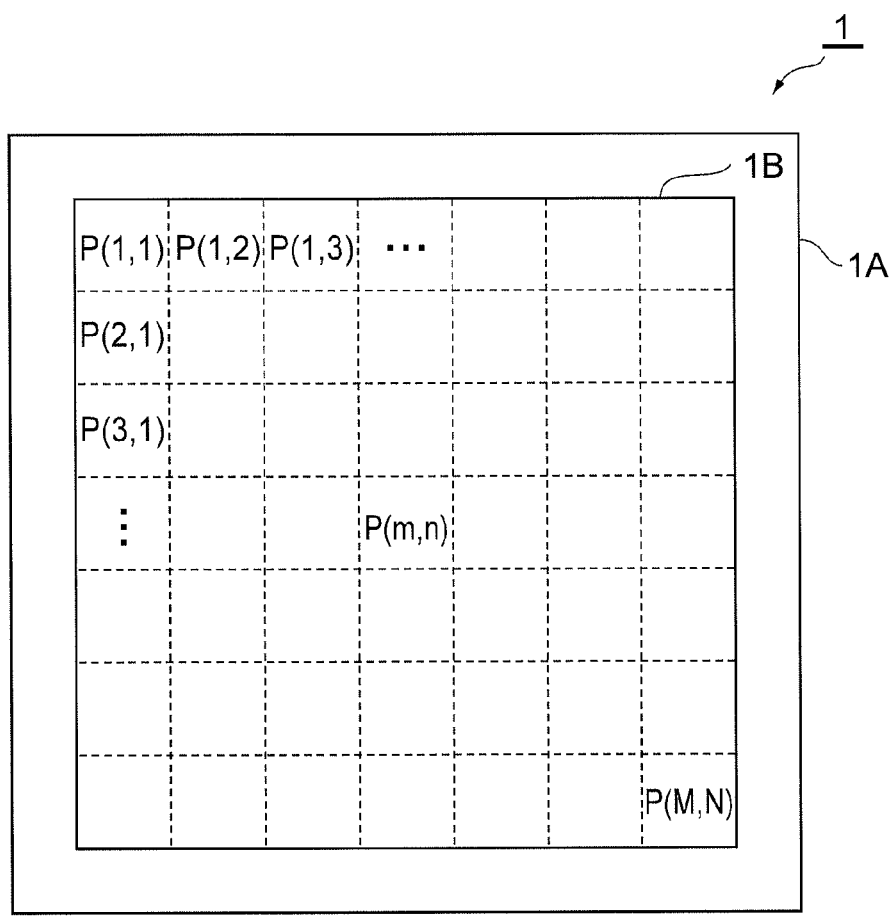
FIG. 3 is a schematic plan view of the range image sensor.

FIG. 3 is a schematic plan view of the range image sensor.

In the range image sensor 1, the semiconductor substrate 1A has an imaging region 1B which includes a plurality of pixels P(m, n) which are disposed in a two-dimensional arrangement. Each pixel P(m, n) outputs two charge quantities (Q1, Q2) as the aforementioned signal d'(m, n) having the distance information. Each pixel P(m, n) functions as a microscopic distance measuring sensor, and outputs the signal d'(m, n) based on the distance to the object H. Therefore, when light reflected from the object H is focused on the imaging region 1B, a range image of the object as a collection of distance information to respective points on the object H can be acquired. A single pixel P(m, n) functions as a single range sensor.

Figure 4:
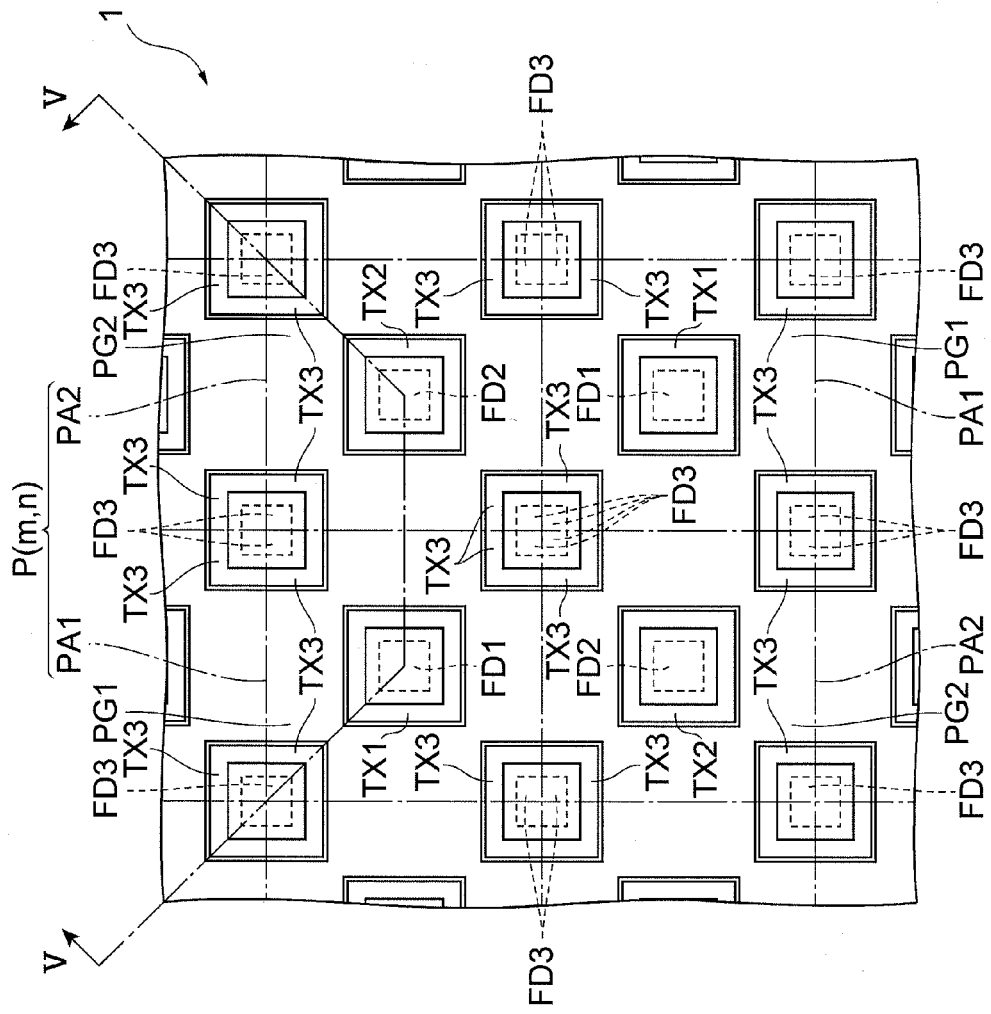
FIG. 4 is a schematic diagram for explaining a configuration of a pixel in the range image sensor.
Figure 5:
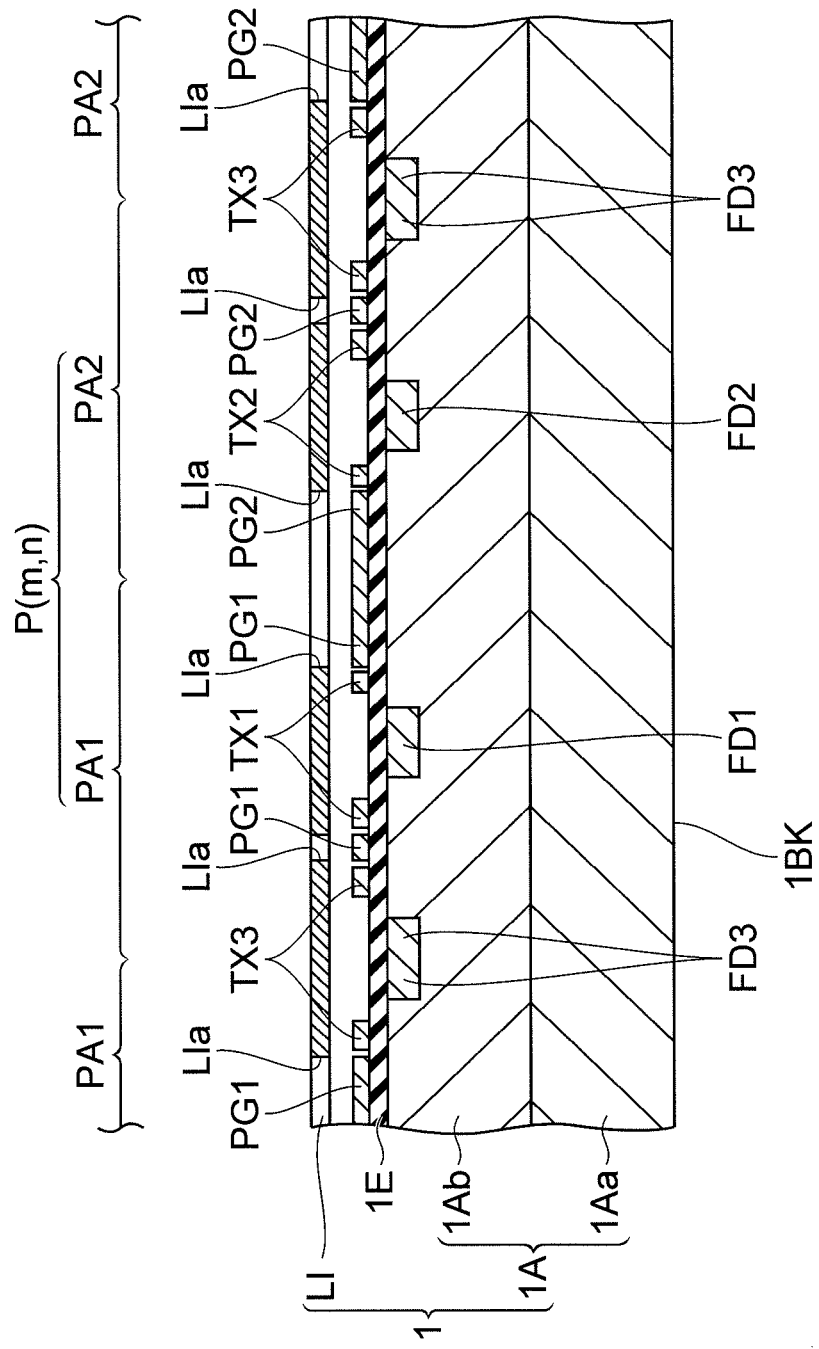
FIG. 5 is a sectional diagram illustrating a cross-sectional configuration of the imaging region along line V-V in FIG. 4.

FIG. 4 is a schematic diagram for explaining a configuration of a pixel in the range image sensor. FIG. 5 is a diagram showing a cross-sectional configuration along the line V-V in FIG. 4.

The range image sensor 1, as shown in FIG. 2, is provided with the semiconductor substrate 1A having the light incident surface 1FT and the back surface 1BK opposed to each other. The semiconductor substrate 1A has a p-type first substrate region 1Aa located on the back surface 1BK side, and a $p^-$-type second substrate region 1Ab located on a light incident surface 1FT side. The second substrate region 1Ab has a higher impurity concentration than the first substrate region 1Aa. The semiconductor substrate 1A may be acquired, for example, by growing a $p^-$-type epitaxial layer on a p-type semiconductor substrate, the $p^-$-type epitaxial layer has a lower impurity concentration than the semiconductor substrate.

Each pixel P(m, n) of the range image sensor 1 includes two pixel regions PA1, PA2 adjacent in a row or column direction. That is, in the range image sensor 1, a first unit disposed in the pixel region PA1 and a second unit disposed in the pixel region PA2 are disposed adjacent in the row or column direction. The first and second units disposed adjacent to in the row or column direction form one pixel P(m, n). The pixel regions PA1, PA2 are approximately polygon-shaped when viewed in a plan view. In the present embodiment, first and second semiconductor regions FD1 and FD2 are rectangle-shaped (in detail, square-shaped). The pixel regions PA1, PA2 are alternately arranged across the imaging region 1B in the row and column directions, and are communicated in the row and column directions.

The range image sensor 1 is provided with, in the pixel region PA1, a photogate electrode PG1, a first gate electrode TX1, a plurality of third gate electrodes TX3, a first semiconductor region FD1, and a plurality of third semiconductor regions FD3. The range image sensor 1 is provided with, in the pixel region PA2, a photogate electrode PG2, a second gate electrode TX2, a plurality of third gate electrodes TX3, a second semiconductor region FD2, and a plurality of third semiconductor regions FD3.

The photogate electrodes PG1, PG2 are provided through an insulating layer 1E on the light incident surface 1FT, and are disposed to be successive in the row and column directions. The first to third gate electrodes TX1, TX2, TX3 are provided through the insulating layer 1E on the light incident surface 1FT, and are located adjacent to the photogate electrodes PG1, PG2. The first to third semiconductor regions FD1, FD2, FD3 accumulate respective charges flowing into regions immediately below the corresponding gate electrodes TX1, TX2, TX3$_1$, TX3$_2$. In the present embodiment, the semiconductor substrate 1A is comprised of Si, and the insulating layer 1E is comprised of SiO$_2$.

Openings LIa are formed at respective regions corresponding to the pixel regions PA1, PA2 in the light-shielding layer LI. These openings LIa are formed in the light-shielding layer LI to be successive in the row and column directions. Light (reflected light from the object H) is incident upon the semiconductor substrate 1A through the openings LIa of the light-shielding layer LI. Therefore, light receiving regions are defined in the semiconductor substrate 1A by the openings LIa. The light-shielding layer LI is comprised of metal such as aluminum or the like, for example.

In the pixel region PA1, the photogate electrode PG1 is disposed to correspond to the opening LIa. In the pixel region PA2, the photogate electrode PG2 is disposed to correspond to the opening LIa. The shapes of the photogate electrodes PG1, PG2 correspond to those of the openings LIa. The outer peripheries of the photogate electrodes PG1, PG2 extend to the sides of the pixel regions PA1, PA2 except for the corner portions of the pixel regions PA1, PA2. The outer peripheries of the photogate electrodes PG1, PG2 extend to the sides of the pixel regions PA1, PA2, and therefore the photogate electrodes PG1, PG2 are continuous with other photogate electrodes PG1, PG2 in the row and column directions. In the pixel regions PA1, PA2, the outer contours of the photogate electrodes PG1, PG2 are approximately "+"-shape, and the inner contours thereof are approximately rectangle-shaped (in detail, square-shaped). Although the photogate electrodes PG1, PG2 are comprised of polysilicon, they may be comprised of other materials.

The first semiconductor region FD1 is disposed inside the photogate electrode PG1 so as to be surrounded by the photogate electrode PG 1. The first semiconductor region FD1 is arranged as spatially separated from a region immediately below the photogate electrode PG1. That is, the first semiconductor region FD1 is disposed inside the light receiving region so as to be surrounded by the light receiving region, and is arranged as spatially separated from the light receiving region.

The second semiconductor region FD2 is disposed inside the photogate electrode PG2 so as to be surrounded by the photogate electrode PG2. The second semiconductor region FD2 is arranged as spatially separated from a region immediately below the photogate electrode PG2. That is, the second semiconductor region FD2 is disposed inside the light receiving region so as to be surrounded by the light receiving region, and is arranged as spatially separated from the light receiving region.

The first and second semiconductor regions FD1, FD2 are approximately polygon-shaped when viewed in a plan view. In the present embodiment, the first and second semiconductor regions FD1, FD2 are rectangle-shaped (in detail, square-shaped). The first and second semiconductor regions FD1, FD2 function as signal charge collecting regions. The first and second semiconductor regions FD1, FD2 are regions comprised of high-impurity concentration n-type semiconductors, and are floating diffusion regions.

The first gate electrode TX1 is disposed between the photogate electrode PG1 (light receiving region) and the first semiconductor region FD1. The first gate electrode TX1 is located outside the first semiconductor region FD1 so as to surround the first semiconductor region FD1, and is also located inside the photogate electrode PG1 so as to be surrounded by the photogate electrode PG1. The first gate electrode TX1 is arranged as spatially separated from the photogate electrode PG1 and the first semiconductor region FD1 so as to be interposed between the photogate electrode PG1 and the first semiconductor region FD1.

The second gate electrode TX2 is disposed between the photogate electrode PG2 (light receiving region) and the second semiconductor region FD2. The second gate electrode TX2 is located outside the second semiconductor region FD2 so as to surround the second semiconductor region FD2, and is also located inside the photogate electrode PG2 so as to be surrounded by the photogate electrode PG2. The second gate electrode TX2 is arranged as spatially separated from the photogate electrode PG2 and the second semiconductor region FD2 so as to be interposed between the photogate electrode PG2 and the second semiconductor region FD2.

The first and second gate electrodes TX1, TX2 are approximately polygonal loop-shaped when viewed in a plan view. In the present embodiment, the first and second gate electrodes TX 1, TX2 are rectangular loop-shaped. Although the first and second gate electrodes TX1 and TX2 are comprised of polysilicon, they may be comprised of other materials. The first and second gate electrodes TX1, TX2 function as transfer electrodes.

The third semiconductor regions FD3 are disposed in the corner portions of the pixel regions PA1 and PA2 and outside the photogate electrodes PG1 and PG2. The third semiconductor regions FD3 are arranged as spatially separated from regions immediately below the photogate electrodes PG1, PG2. That is, the third semiconductor regions FD3 are disposed outside the light receiving regions, and are also arranged as spatially separated from the light receiving regions.

In the pixel regions PA1, PA2, the third semiconductor regions FD3 are approximately polygon-shaped when viewed in a plan view. In the present embodiment, the third semiconductor regions FD3 are approximately rectangle-shaped (in detail, square-shaped). The third semiconductor regions FD3 adjacent in a row and column directions are integrated with each other. As a result, in four pixel regions PA1, PA2 adjacent in the row and column directions, four third semiconductor regions FD3 located at the center portion of the pixel regions PA1, PA2 are single rectangle-shaped (in detail, single square-shaped). The third semiconductor regions FD3 function as unnecessary charge collecting regions. The third semiconductor regions FD3 are regions comprised of high-impurity concentration n-type semiconductors, and are floating diffusion regions.

The third gate electrode TX3 is disposed between the photogate electrodes PG1, PG2 (light receiving regions) and the third semiconductor region FD3. The third gate electrode TX3 is arranged as spatially separated from the photogate electrodes PG1, PG2 and the third semiconductor region FD3 so as to be interposed between the photogate electrodes PG1, PG2 and the third semiconductor region FD3. Although the third gate electrode TX3 is comprised of polysilicon, it may be comprised of other materials. The third gate electrode TX3 functions as an unnecessary charge collecting gate electrode.

In the pixel regions PA1, PA2, the third gate electrodes TX3 are "L"-shaped when viewed in a plan view. The ends of the third gate electrodes TX3 extend to the sides of the pixel regions PA1 and PA2, whereby the third gate electrodes TX3 are continuous with the third gate electrodes TX3 adjacent in the row and column directions. That is, in the four pixel regions PA1, PA2 adjacent in the row and column directions, four third gate electrode TX3 located at the center portions of the pixel regions PA1, PA2 are approximately rectangular loop-shaped. The four third gate electrodes TX3 which are approximately rectangular loop-shaped as a whole are located outside the four third semiconductor regions FD3 which are rectangle-shaped as a whole so as to surround the corresponding four third semiconductor regions FD3.

The photogate electrode PG1 and the first gate electrode TX1 are concentrically disposed around the first semiconductor region FD1 in the order of the first gate electrode TX1 and the photogate electrode PG1 from a first semiconductor region FD1 side. The photogate electrode PG2 and the second gate electrode TX2 are concentrically disposed around the second semiconductor region FD2 in the order of the second gate electrode TX2 and the photogate electrode PG2 from a second semiconductor region FD2 side.

The thickness/impurity concentration of each of the regions is as follows:
first substrate region 1Aa of semiconductor substrate 1A: thickness 5~700 μm/impurity concentration $1 \times 10^{18} \sim 10^{20}$ $cm^{-3}$
second substrate region 1Ab of semiconductor substrate 1A: thickness 3~50 μm/impurity concentration $1 \times 10^{13} \sim 10^{16}$ $cm^{-3}$
first and second semiconductor regions FD1, FD2: thickness 0.1~0.4 μm/impurity concentration $1 \times 10^{18} \sim 10^{20}$ $cm^{-3}$
third semiconductor regions FD3: thickness 0.1~0.4 μm/impurity concentration $1 \times 10^{18} \sim 10^{20}$ $cm^{-3}$ Contact holes (not shown) are formed through the insulating layer 1E so as to expose the surfaces of the first to third semiconductor regions FD1, FD2, FD3 to the outside. Conductors (not shown) are disposed in the contact holes so as to connect the first to third semiconductor regions FD1, FD2, FD3 to the outside.

The light-shielding layer LI covers a region where the first to third gate electrodes TX1, TX2, TX3 and the first to third semiconductor regions FD1, FD2, FD3 are disposed in the semiconductor substrate 1A, and prevents light from being incident upon the corresponding region. This can prevent unnecessary charges from being generated by light which is incident upon the region.

The regions corresponding to the photogate electrodes PG1, PG2 in the semiconductor substrate 1A (regions immediately below the photogate electrodes PG1, PG2) function as charge generating regions where charges are generated in response to the incident light. Therefore, the shapes of the charge generating regions correspond to those of the photogate electrodes PG1, PG2 and the openings LIa. That is, in the pixel regions PA1, PA2, the outer peripheries of the charge generating regions extend to the sides of the pixel regions PA1, PA2 except for the corner portions of the pixel regions PA1, PA2. In detail, in the pixel regions PA1, PA2, the outer contours of the charge generating regions are approximately "+"-shaped, and the inner contours thereof are approximately rectangle-shaped (in detail, square-shaped). The outer peripheries of the charge generating regions extend to the sides of the pixel regions PA1, PA2, and therefore the charge generating regions are continuous with other charge generating regions in the row and column directions.

When a high level signal (positive electric potential) is supplied to the first gate electrode TX1, a potential below the first gate electrode TX1 becomes lower than potentials in regions immediately below the photogate electrodes PG1, PG2 in the semiconductor substrate 1A. This causes the negative charge (electrons) to be drawn toward the first gate electrode TX1 and to be accumulated in potential well formed by the first semiconductor region FD1. The first gate electrode TX1 causes a signal charge to flow into the first semiconductor region FD1 in response to the input signal. An n-type semiconductor contains a positively ionized donor and has a positive potential, so as to attract electrons. When a low level signal (for example, a ground electric potential) is supplied to the first gate electrode TX1, a potential barrier is generated by the first gate electrode TX1. Therefore, the charges generated in the semiconductor substrate 1A are not drawn into the first semiconductor region FD1.

When a high level signal (positive electric potential) is supplied to the second gate electrode TX2, a potential below the second gate electrode TX2 becomes lower than the potentials in regions immediately below the photogate electrodes PG1, PG2 in the semiconductor substrate 1A. This causes negative charges (electrons) to be drawn toward the second gate electrode TX2 and to be accumulated in a potential well formed by the second semiconductor region FD2. The second gate electrode TX2 causes a signal charge to flow into the second semiconductor region FD2 in response to the input signal. When a low level signal (for example, a ground electric potential) is supplied to the second gate electrode TX2, a potential barrier is generated by the second gate electrode TX2. Therefore, charges generated in the semiconductor substrate 1A are not drawn into the second semiconductor region FD2.

When a high level signal (a positive electric potential) is supplied to the third gate electrodes TX3, potentials in regions immediately below the third gate electrodes TX3 become lower than the potentials in regions immediately below the photogate electrodes PG1, PG2 in the semiconductor substrate 1A. This causes negative charges (electrons) to be drawn toward the third gate electrodes TX3 and to be accumulated in potential wells formed by the third semiconductor regions FD3. When a low level signal (for example, a ground electric potential) is supplied to the third gate electrodes TX3, potential barriers are generated by the third gate electrodes TX3. Therefore, charges generated in the semiconductor substrate 1A are not drawn into the third semiconductor regions FD3. The third semiconductor regions FD3 collect some of charges generated in the charge generating region in response to the incidence of light as unnecessary charges.

In the range image sensor 1, charges generated in the deep semiconductor portion in response to incidence of light for projection are drawn into a potential well provided on the light incident surface 1FT side, whereby high-speed and accurate distance measurement is possible.

Pulse light $L_D$ from the object incident through the light incident surface 1FT of the semiconductor substrate 1A reaches the light receiving region (charge generating region) disposed on a surface side of the semiconductor substrate 1A. Charges generated in the semiconductor substrate 1A in response to the incidence of pulse light are transferred from each of charge generating regions (each of regions immediately below the photogate electrodes PG1, PG2 to regions immediately below the first or second gate electrode TX1, TX2 adjacent to the corresponding charge generating region. That is, when detection gate signals $S_1$ and $S_2$ synchronized with the pulse drive signal $S_P$ of the light source are alternately supplied to the first and second gate electrodes TX1, TX2 via the wiring substrate 10, charges generated in each charge generating region flow to regions immediately below the first or second gate electrode TX1, TX2, and then flow therefrom to the first or second semiconductor region FD1, FD2.

The ratio of the charge quantity Q1 or Q2 accumulated in the first semiconductor region FD1 or second semiconductor region FD2 to the total charge quantity (Q1+Q2) correspond to the phase difference between the emitted pulse light emitted with supply of the pulse drive signal $S_P$ to the light source and the detected pulse light returning after reflection of the emitted pulsed light on the object H.

Although not shown in the diagrams, the range image sensor 1 is provided with a back-gate semiconductor region for fixing the electric potential of the semiconductor substrate 1A to a reference electric potential.

Figure 6:
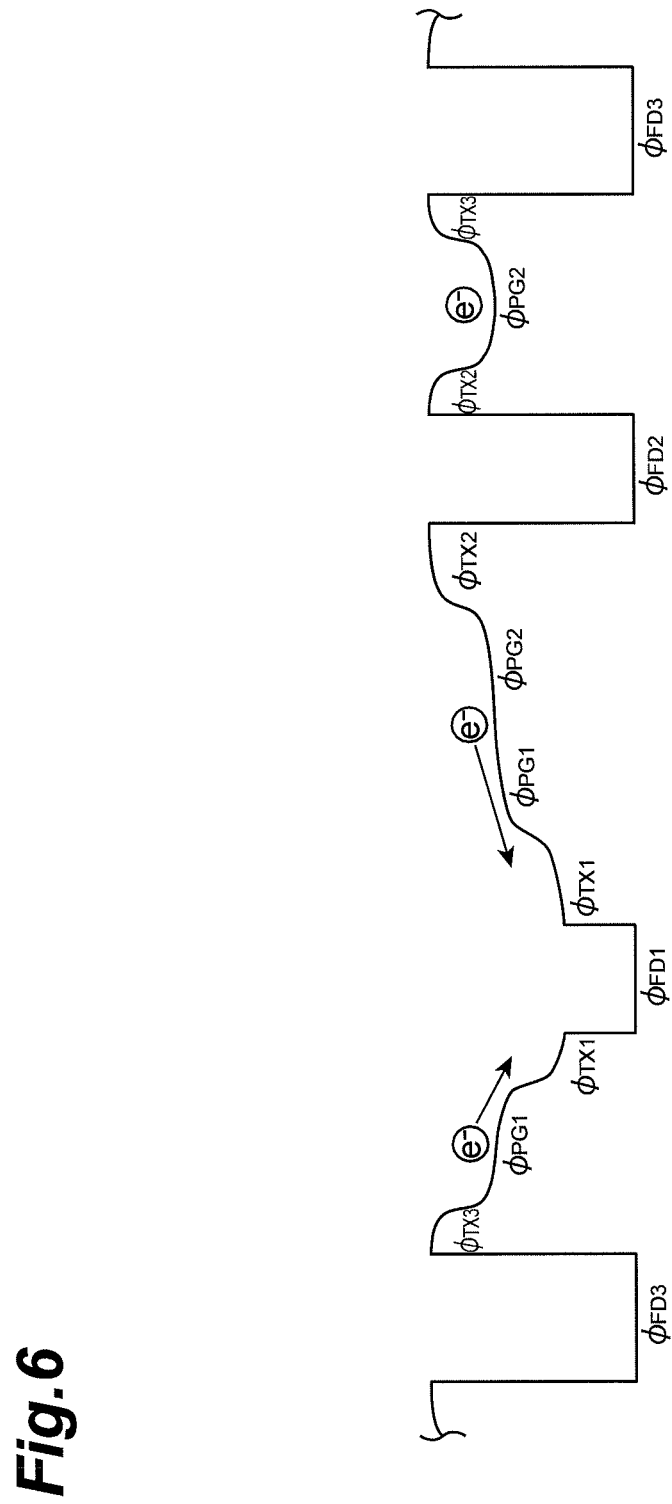
FIG. 6 is a diagram illustrating a potential profile, for explaining an accumulation operation of charge.
Figure 7:
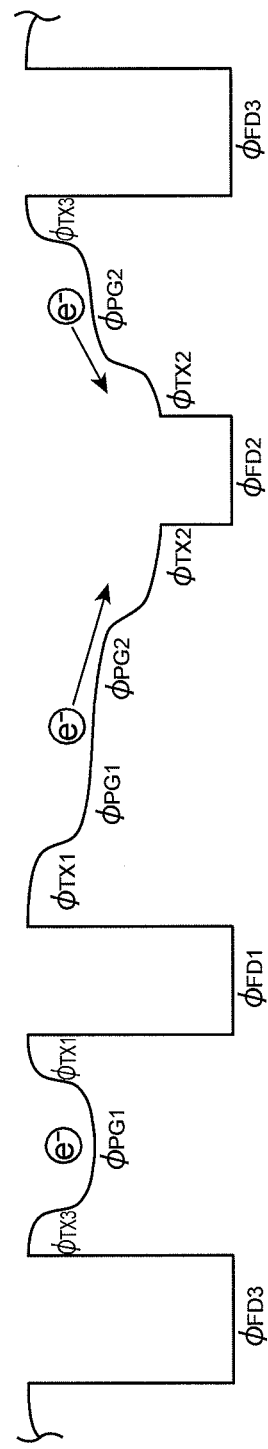
FIG. 7 is a diagram illustrating a potential profile, for explaining an accumulation operation of charge.
Figure 8:
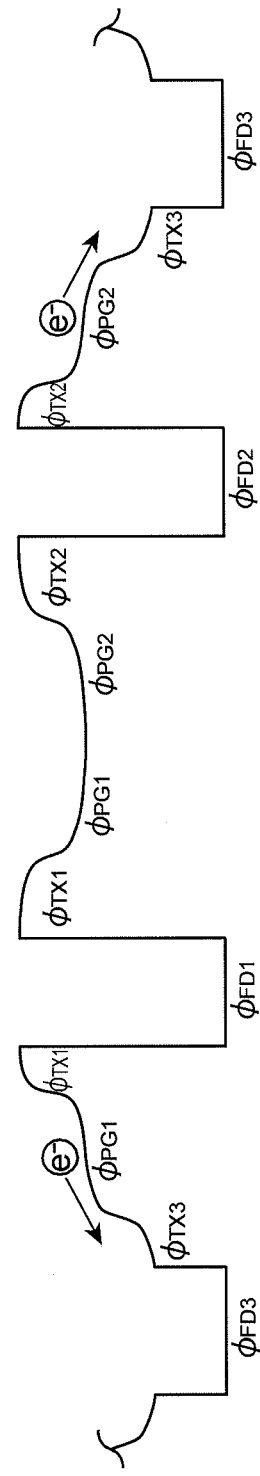
FIG. 8 is a diagram illustrating a potential profile, for explaining a discharge operation of charge.

FIGS. 6 and 7 are diagrams illustrating potential profiles near the light incident surface 1FT of the semiconductor substrate 1A, for explaining an accumulation operation of charge. FIG. 8 is a diagram illustrating a potential profile near the light incident surface 1FT of the semiconductor substrate 1A, for explaining a discharge operation of charge. In FIGS. 6 to 8, a downward direction is a positive potential direction. FIGS. 6 to 8 show potential profiles taken along line V-V of FIG. 4.

When light is incident, potentials $\phi_{PG1}$, $\phi_{PG2}$ in regions immediately below the photogate electrodes PG1, PG2 are set slightly higher than the substrate electric potential due to an electric potential (for example, the intermediate electric potential between a higher electric potential and a lower electric potential applied to the first and second gate electrodes TX1, TX2) supplied to the photogate electrodes PG1, PG2. In each of the diagrams, a potential $\phi_{TX1}$ in a region immediately below the first gate electrode TX1, a potential $\phi_{TX2}$ in a region immediately below the second gate electrode TX2, a potentials $\phi_{TX3}$ in a region immediately below the third gate electrode TX3, a potential $\phi_{FD1}$ in the first semiconductor region FD1, a potential $\phi_{FD2}$ in the second semiconductor region FD2, and a potential $\phi_{FD3}$ in the third semiconductor region FD3 are shown.

When the high electric potential of the detection gate signal S1 is input to the first gate electrode TX1, charges chiefly generated immediately below the photogate electrode PG1 are accumulated in the potential well of the first semiconductor region FD1 through the region immediately below the first gate electrode TX1 because of a potential gradient, as shown in FIG. 6. Charges corresponding to the charge quantity Q1 are accumulated in the potential well of the first semiconductor region FD1. A low level electric potential (for example, a ground electric potential) is supplied to the second gate electrode TX2. For this reason, the potential $\phi_{TX2}$ in the region immediately below the second gate electrode TX2 is not lowered, and charges do not flow into the potential well of the second semiconductor region FD2.

When the high electric potential of the detection gate signal S2 is input to the second gate electrode TX2, subsequent to the detection gate signal S1, charges chiefly generated immediately below the photogate electrode PG2 are accumulated in the potential well of the second semiconductor region FD2 through the region immediately below the second gate electrode TX2 because of a potential gradient, as shown in FIG. 7. Charges corresponding to the charge quantity Q2 are accumulated in the potential well of the second semiconductor region FD2. A low level electric potential (for example, a ground electric potential) is supplied to the first gate electrode TX1. For this reason, the potential $\phi_{TX1}$ in the region immediately below the first gate electrode TX1 is not lowered, and charges do not flow into the potential well of the first semiconductor region FD1.

While the detection gate signal S1 is being applied to the first gate electrode TX1 and the detection gate signal S2 is being applied to the second gate electrode TX2, a low level electric potential (for example, a ground electric potential) is supplied to the third gate electrode TX3. For this reason, a potential $\phi_{TX3}$ in a region immediately below the third gate electrode TX3 is not lowered, and charges do not flow into the potential well of the third semiconductor region FD3.

When a positive electric potential is supplied to the third gate electrode TX3, charges generated in the charge generating regions (regions immediately below the photogate electrodes PG1, PG2) flow into the potential well of the third semiconductor region FD3 as the potential $\phi_{TX3}$ in a region immediately below the third gate electrode TX3 is lowered, as shown in FIG. 8. This causes charges, generated in the charge generating regions, to be accumulated in the potential well of the third semiconductor region FD3 as unnecessary charges. The unnecessary charges accumulated in the potential well of the third semiconductor region FD3 are discharged to the outside. While a positive electric potential is being supplied to the third gate electrode TX3, a low level electric potential is supplied to the first and second gate electrodes TX1, TX2. For this reason, potentials $\phi_{TX1}$ and $\phi_{TX2}$ in regions immediately below the first and second gate electrodes TX1, TX2 are not lowered, and charges do not flow into the potential wells of the first and second semiconductor regions FD1, FD2.

Figure 9:
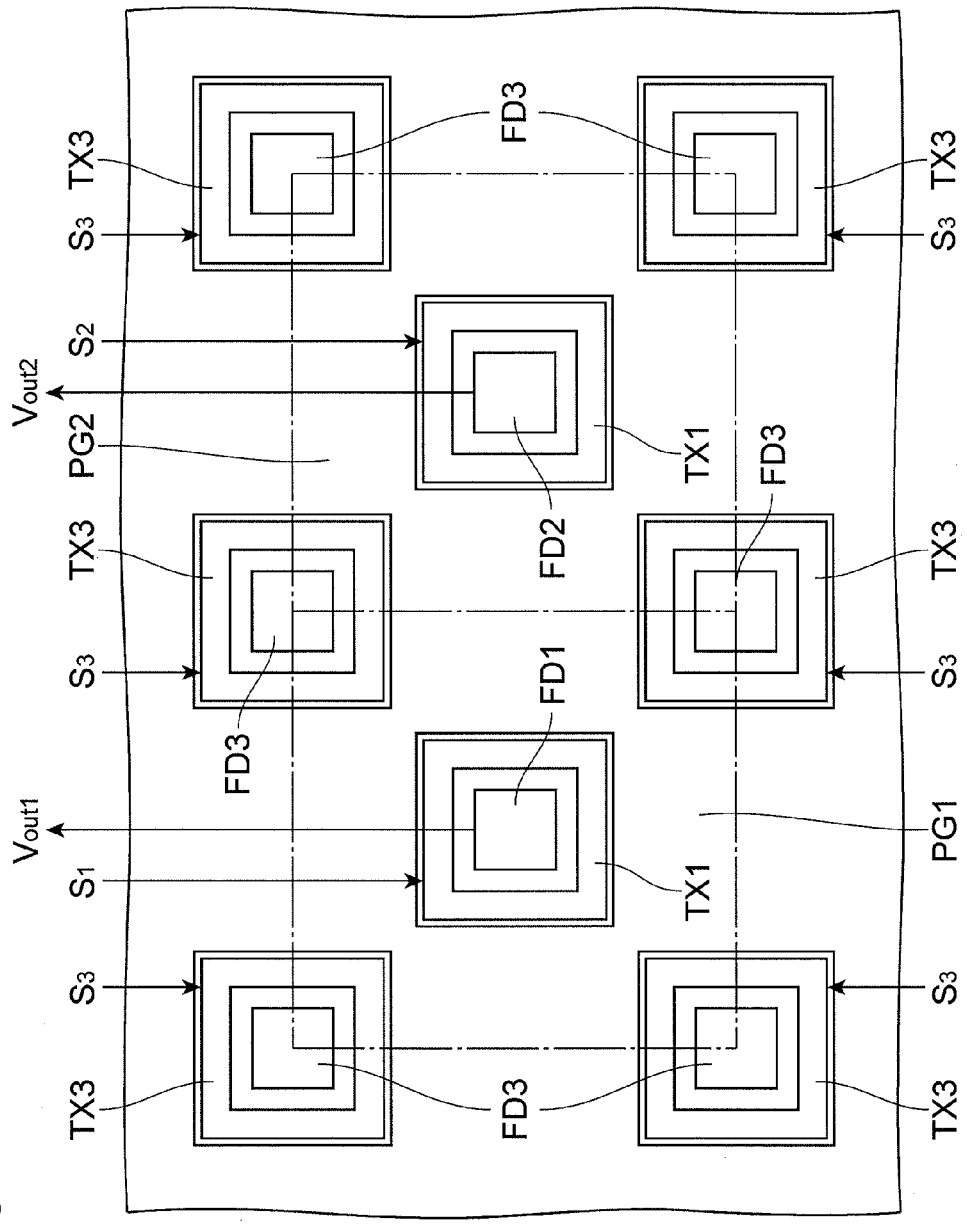
FIG. 9 is a schematic diagram illustrating a configuration of a pixel.

FIG. 9 is a schematic diagram for explaining a configuration of a pixel.

The detection gate signal $S_1$, which is a charge transfer signal, is supplied to the first gate electrode TX1. The detection gate signal $S_2$, which is a charge transfer signal, is supplied to the second gate electrode TX2. That is, charge transfer signals having different phases are supplied to the first gate electrode TX1 and the second gate electrode TX2. A charge transfer signal $S_3$ is supplied to the third gate electrode TX3.

Charges generated in the charge generating region (chiefly in the region immediately below photogate electrode PG1) flow as signal charges into the potential well composed of the first semiconductor region FD1 while the high level detection gate signal $S_1$ is supplied to the first gate electrode TX1. The signal charges accumulated in the first semiconductor region FD1 are read out as an output $V_{out1}$ corresponding to the charge quantity Q1 from the first semiconductor region FD1. Charges generated in the charge generating region (chiefly in the region immediately below the photogate electrode PG2) flow as signal charges into the potential well composed of the second semiconductor region FD2 while the high level detection gate signal $S_2$ is supplied to the second gate electrode TX2. The signal charges accumulated in the second semiconductor region FD2 are read out as an output $V_{out2}$ corresponding to the charge quantity Q2 from the second semiconductor region FD2. These outputs $V_{out1}$, $V_{out2}$ correspond to the above-described signal d'(m, n).

Figure 10:
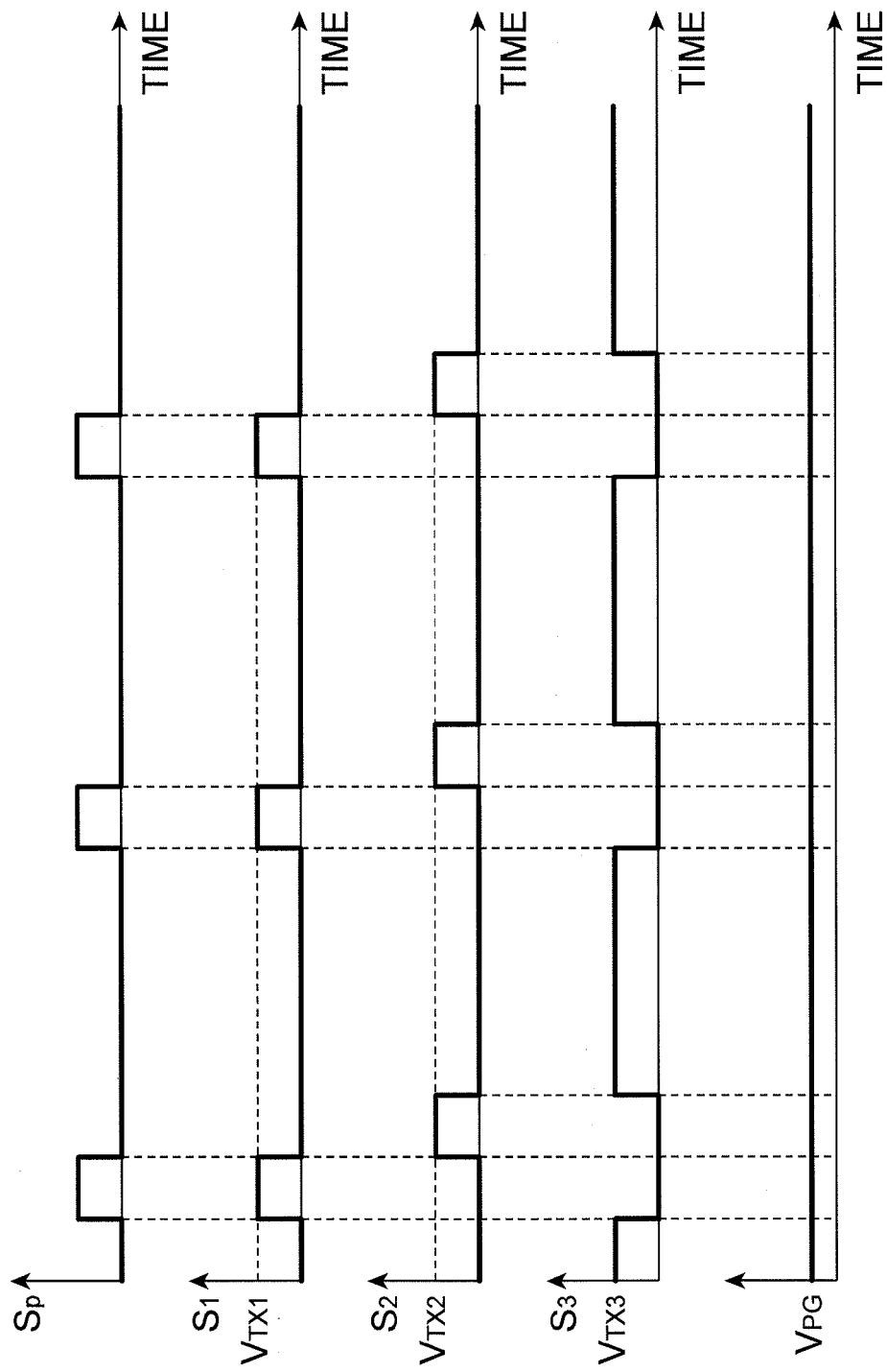
FIG. 10 is a timing chart of various signals.

FIG. 10 is a timing chart of actual various signals.

The period of a single frame consists of a period for accumulation of signal charge (accumulation period) and a period for readout of signal charge (readout period). With focus on a single pixel, during the accumulation period, a signal based on the pulse drive signal $S_P$ is applied to the light source, and the detection gate signal $S_1$ is applied to the first gate electrode TX1, in synchronism therewith. Furthermore, the detection gate signal $S_2$ having a predetermined phase difference (for example, a phase difference of 180°) with respect to the detection gate signal $S_1$ is applied to the second gate electrode TX2. Prior to the measurement of the distance, a reset signal is applied to the first and second semiconductor regions FD1, FD2, and charges accumulated therein are discharged to the outside. After the reset signal is turned on and then turned off, the pulses of the detection gate signals $S_1$, $S_2$ are sequentially applied to the first and second gate electrodes TX1, TX2, and furthermore charges are sequentially transferred in synchronization with the pulses. Then, the signal charges are integrated and accumulated in the first and second semiconductor regions FD1 and FD2.

Thereafter, during the readout period, the signal charges accumulated in the first and second semiconductor regions FD1, FD2 are read. At this time, the charge transfer signal $S_3$ applied to the third gate electrode TX3 is at the high level, and therefore the positive electric potential is supplied to the third gate electrode TX3, whereby unnecessary charges are collected into the potential well of the third semiconductor region FD3. When the detection gate signals $S_1$, $S_2$ applied to the first and second gate electrodes TX1, TX2 are all at a low level, he charge transfer signal $S_3$ applied to the third gate electrode TX3 is at a high level.

An electric potential $V_{PG}$ supplied to the photogate electrodes PG1, PG2 is set lower than the electric potentials $V_{TX1}$, $V_{TX2}$, $V_{TX31}$, $V_{TX32}$. Accordingly, when the detection gate signals $S_1$, $S_2$ are at the high level, the potentials $\phi_{TX1}$, $\phi_{TX2}$ become lower than the potentials $\phi_{PG1}$, $\phi_{PG2}$. When the charge transfer signal $S_3$ is at the high level, the potential $\phi_{TX3}$ becomes lower than the potentials $\phi_{PG1}$, $\phi_{PG2}$.

The electric potential $V_{PG}$ is set higher than the electric potential yielded when the detection gate signals $S_1$ and $S_2$ and the charge transfer signal $S_3$ are at a low level. When the detection gate signals $S_1$, $S_2$ are at a low level, the potentials $\phi_{TX1}$, $\phi_{TX2}$ become higher than the potentials $\phi_{PG1}$, $\phi_{PG2}$. Furthermore, when the charge transfer signal $S_3$ is at a low level, the potential $\phi_{TX3}$ becomes higher than the potentials $\phi_{PG1}$, $\phi_{PG2}$.

As described above, in the present embodiment, the outer peripheries of the charge generating regions (regions immediately below the photogate electrodes PG1, PG2) extend to the sides of the pixel regions PA1, PA2 except for the corner portions of the pixel regions PA1, PA2, and therefore the areas of the charge generating regions are enlarged. This can improve the aperture ratio.

When the charge generating regions extend to corner portions of the pixel regions PA1, PA2, the distances charges generated in regions corresponding to the corner portions of the pixel regions PA1, PA2 in the charge generating regions migrate to the first and second semiconductor regions FD1, FD2 located at the center portions of the pixel regions PA1, PA2 are long. For this reason, the transfer time of the charges, generated in regions corresponding to the corner portions, to the first and second semiconductor regions FD1, FD2 is increased, and therefore the efficiency of the transfer of signal charges to the first and second semiconductor regions FD1, FD2 is deteriorated. In contrast to this, in the present embodiment, the charge generating regions are not disposed in the corner portions of the pixel regions PA1, PA2, and therefore signal charges are not be transferred from regions which cause the distances the charges migrate to be longer, as described above. For this reason, the efficiency of the transfer of signal charges to the first and second semiconductor regions FD1, FD2 is improved.

The third semiconductor regions FD3 are disposed in the corner portions of the pixel regions PA1, PA2 where charge generating regions are not disposed. For this reason, the third semiconductor regions FD3 can be disposed without degrading the aperture ratio and the efficiency of the transfer of charges.

This allows an accuracy of distance detection to be improved, in the range image sensor 1 according to the present embodiment.

In the meantime, in the present embodiment, the first and second semiconductor regions FD1, FD2 are located inside the photogate electrodes PG1, PG2, and the areas of the first and second semiconductor regions FD1, FD2 are set smaller than those of the photogate electrodes PG1, PG2. For this reason, the areas of the first and second semiconductor regions FD1, FD2 are largely reduced, relative to areas of regions available for transfer of charges to the first and second semiconductor regions FD1, FD2, in regions (charge generating regions) immediately below the photogate electrodes PG1, PG2. The charges (charge quantities Q1, Q2) accumulated after transferred to the first and second semiconductor regions FD1, FD2 generate respective voltage changes ($\Delta V$) represented by the formulae below, based on the capacitance Cfd of the first and second semiconductor regions FD1, FD2:

$$\Delta V = Q1/Cfd$$

$$\Delta V = Q2/Cfd$$

Therefore, when the areas of the first and second semiconductor regions FD1, FD2 are reduced, the capacitance Cfd of the first and second semiconductor regions FD1, FD2 are reduced, and therefore the voltage changes ($\Delta V$) increase. That is, the charge voltage conversion gain increases. As a result, high sensitivity of the range image sensor 1 can be achieved.

The first gate electrode TX1 surrounds the entire periphery of the first semiconductor region FD1. The second gate electrode TX2 surrounds the entire periphery of the second semiconductor region FD2. For this reason, signal charges are collected in the first and second semiconductor regions FD1, FD2 from all directions of the first and second semiconductor regions FD1, FD2. As a result, the area efficiency (aperture ratio) of the imaging region can be improved.

In the present embodiment, the charge generating regions of a plurality of pixel regions PA1, PA2 are integrated with each other, and the photogate electrodes PG1, PG2 of a plurality of pixel regions PA1, PA2 are integrated with each other. This can increase the usage efficiency of the sensor area. Furthermore, the third semiconductor regions FD3 of a plurality of pixel regions PA1, PA2 are integrated with each other. This can also increase the usage efficiency of the sensor area.

Next, referring to FIGS. 11 to 17, the configuration of a range image sensor 1 according to a modification example of the present embodiment will be described.

Figure 11:
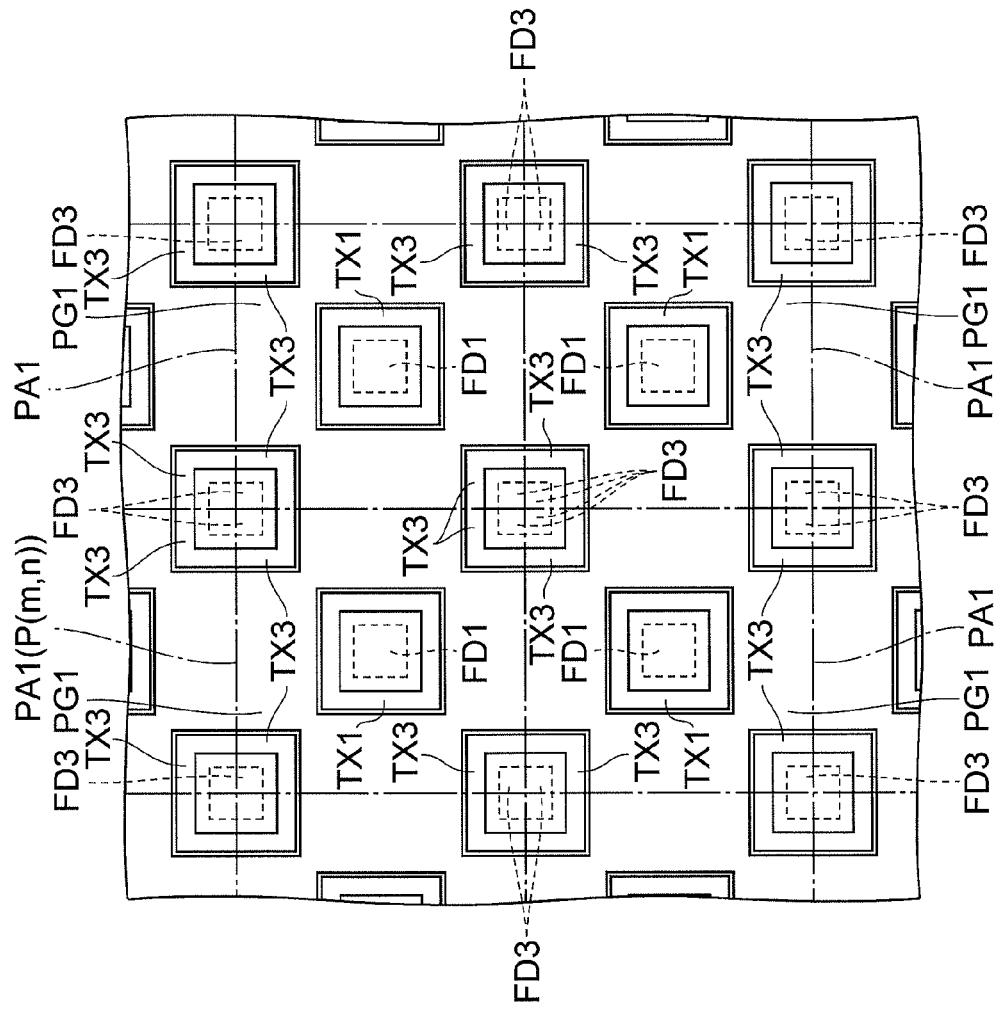
FIG. 11 is a schematic diagram illustrating a configuration of a pixel of a range image sensor according to a modification example.

The modification example shown in FIG. 11 is different from the above-described embodiment in that the first unit disposed in the single pixel region PA1 constitutes the single pixel P(m, n). FIG. 11 is a schematic diagram illustrating the configuration of a pixel of the range image sensor according to the modification example.

The range image sensor of the present modification example is provided with the photogate electrode PG1, the first gate electrode TX1, the plurality of third gate electrodes TX3, the first semiconductor region FD1, and third semiconductor regions FD3, in each pixel P(m, n). The configuration of the single pixel region PA1 which constitutes each pixel P(m, n) is the same as that of the pixel region PA1 of the above-described embodiment.

The outer peripheries of the photogate electrode PG1 of each pixel region PA1 extend to the sides of the pixel region PA1, and therefore the photogate electrode PG1 is continuous with the other photogate electrodes PG1 in the row and column directions. The third semiconductor regions FD3 of each pixel region PA1 are integrated with the third semiconductor regions FD3 adjacent in the row and column directions. As a result, in four pixel regions PA1 adjacent in the row and column directions, four third semiconductor regions FD3 located at the center portion of the pixel regions PA1 are rectangle-shaped (in detail, square-shaped). The ends of the third gate electrodes TX3 of each pixel region PA1 extend to the sides of the pixel region PA1, and therefore the third gate electrodes TX3 are continuous with other third gate electrodes TX3 in the row and column directions. In the four pixel regions PA1 adjacent in the row and column directions, four third gate electrodes TX3 located at the center portion of the pixel regions PA1 are approximately rectangular loop-shaped.

Figure 12:
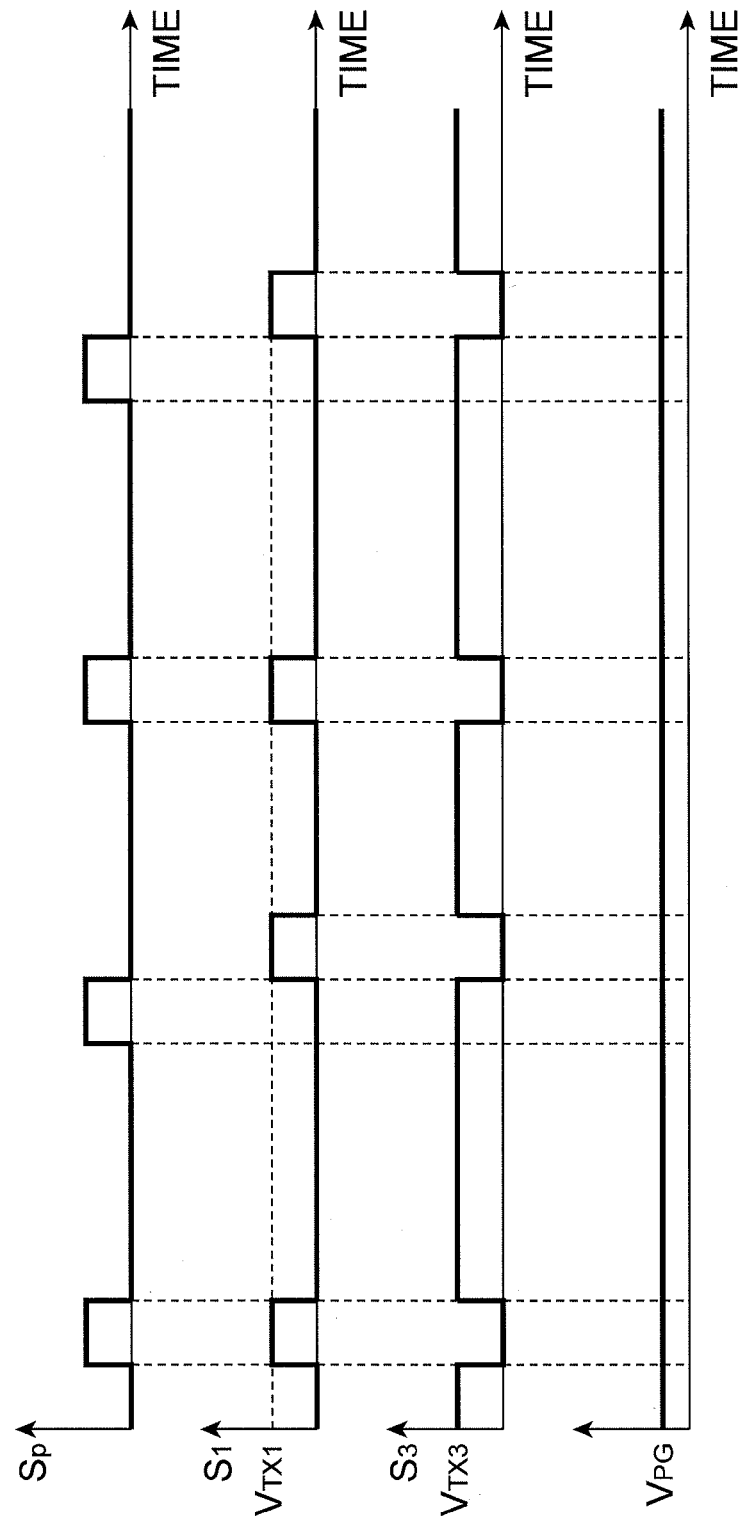
FIG. 12 is a timing chart of various signals.

FIG. 12 is a timing chart of various signals in the modification example shown in FIG. 11. As shown in FIG. 12, the detection gate signal $S_1$ applied to the first gate electrode TX1 is intermittently given a phase shift at a predetermined timing. In the present modification example, the detection gate signal $S_1$ is given a phase shift of 180° at a timing of 180°. The detection gate signal $S_1$ is synchronized with a pulse drive signal $S_P$ at a timing of 0°, and has a phase difference of 180° with respect to the pulse drive signal $S_P$ at a timing of 180°. The phases of the detection gate signal $S_1$ and the charge transfer signal $S_3$ are opposite.

In the present modification example, signal charges accumulated in the first semiconductor region FD1 are read out as an output $V_{out1}$ from the first semiconductor region FD1 at a timing of 0°, and signal charges accumulated in the first semiconductor region FD1 are read out as an output $V_{out2}$ from the first semiconductor region FD1 at a timing of 180°. These outputs $V_{out1}$, $V_{out2}$ correspond to the above-described signal d'(m, n). One pixel region PA1 including the photogate electrode PG1 (charge generating region immediately below the photogate electrode PG1) corresponds to one pixel, and the distance is calculated based on outputs from the same pixel. For this reason, this configuration can reduce the deviation in the calculation of the distance compared to a configuration in which a plurality of pixel regions PA1, PA2 corresponds to one pixel. Furthermore, this configuration can increase the usage efficiency of the sensor area and therefore improve space resolution.

The detection gate signal S1 may be given a phase shift of 90° at a timing of 90°, a phase shift of 180° at a timing of 180°, and a phase shift of 270° at a timing of 270°. In this case, signal charges accumulated in the first semiconductor region FD1 are read out as outputs at a timing of 0°, 90°, 180°, and 270° from the first semiconductor region FD1, and the distance is calculated based on these output.

Figure 13:
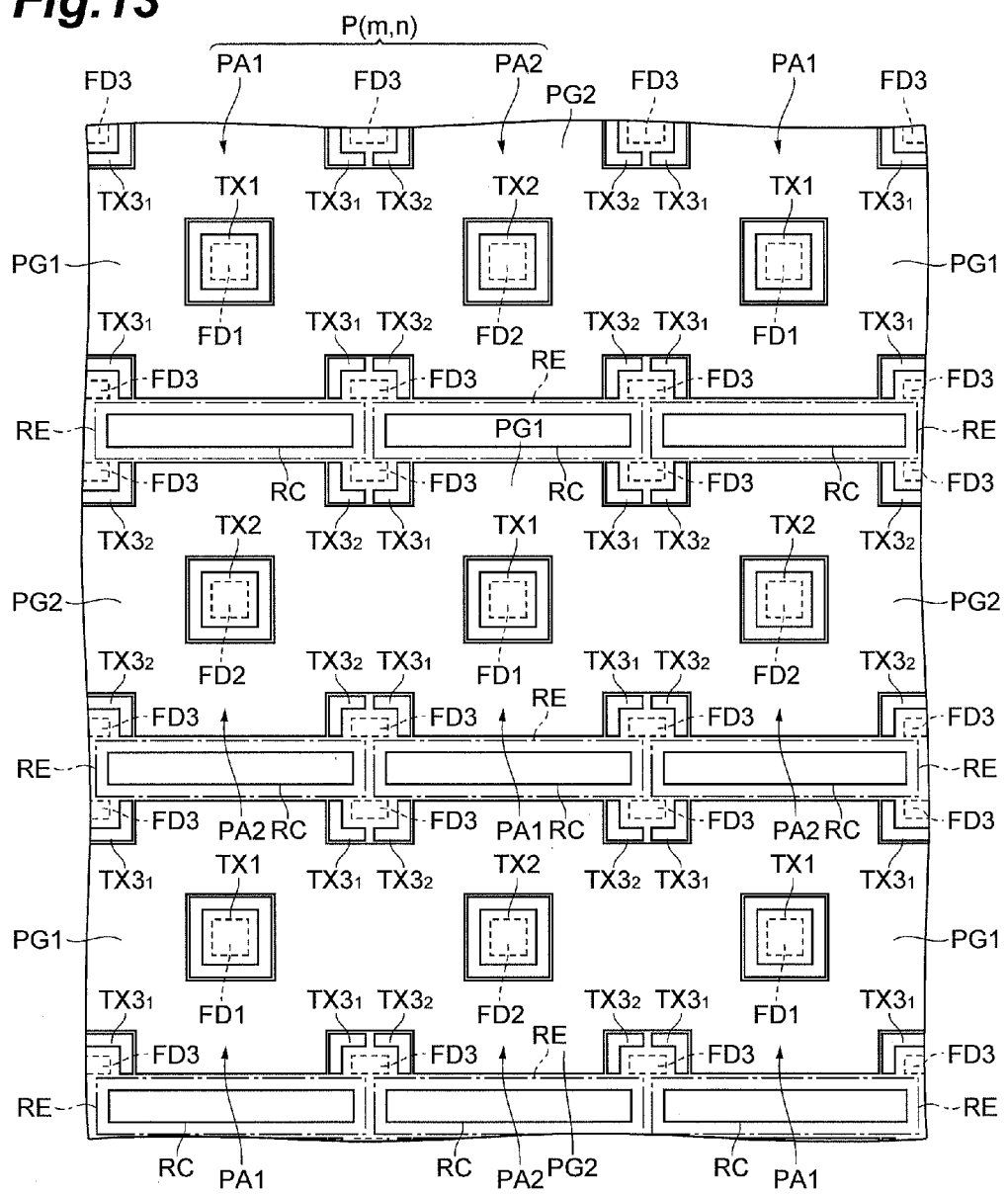
FIG. 13 is a schematic diagram illustrating a configuration of pixels of a range image sensor according to a modification example.

The variation shown in FIG. 13 is different from the above-described embodiment in that regions RE where readout circuits RC are disposed are set therein. FIG. 13 is a schematic diagram illustrating the configuration of pixels of a range image sensor according to the modification example.

The regions RE where the readout circuits RC are disposed are set for respective pixel regions PA1, PA2. The readout circuits RC read out signals corresponding to the charge quantities accumulated in the first or second semiconductor regions FD1, FD2 of the corresponding pixel regions PA1, PA2. The readout circuits RC are constituted by Floating Diffusion Amplifiers (FDAs) or the like. The regions RE are located along one of the sides of the pixel regions PA1, PA2 and on the outsides of corresponding pixel regions PA1, PA2. In the present modification example, the regions RE are located along one of the sides of the pixel regions PA1, PA2 which extend in the row direction, and are disposed between the pixel regions PA1, PA2 adjacent in the column direction.

In the present modification example, third gate electrodes $TX3_1$ disposed in the pixel regions PA1 and third gate electrodes $TX3_2$ disposed in the pixel regions PA2 are spaced apart from each other. Charge transfer signals $S_{31}$ are supplied to the third gate electrode $TX3_1$, and charge transfer signals $S_{32}$ are supplied to the third gate electrode $TX3_2$.

Figure 14:
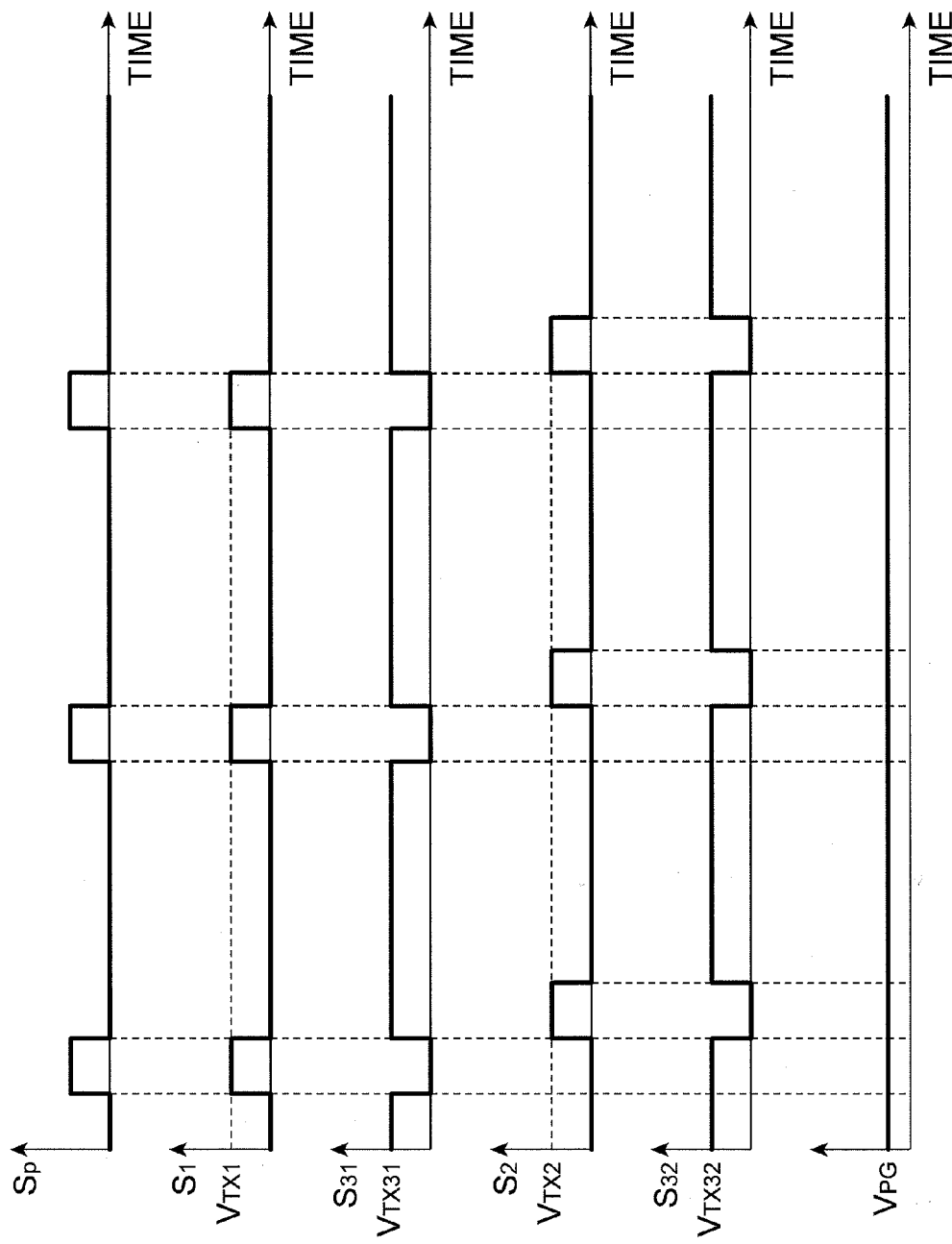
FIG. 14 is a timing chart of various signals.

FIG. 14 is a timing chart of various signals in the modification example shown in FIG. 13.

While a detection gate signal $S_1$ is being applied to a first gate electrode TX1, a low level electric potential (for example, a ground electric potential) is supplied to the third gate electrode $TX3_1$. For this reason, a potential $\phi_{TX31}$ in a region immediately below the third gate electrode $TX3_1$ is not lowered, and charges do not flow into the potential well of the third semiconductor region FD3. While a detection gate signal $S_2$ is being applied to the second gate electrode TX2, a low level electric potential (for example, a ground electric potential) is supplied to the third gate electrode $TX3_2$. For this reason, a potential $\phi_{TX32}$ in a region immediately below the third gate electrode $TX3_2$ is not lowered, and charges do not flow into the potential well of the third semiconductor region FD3.

The charge transfer signals $S_{31}$, $S_{32}$ applied to the third gate electrode $TX3_1$, $TX3_2$ are at a high level, positive electric potentials are supplied to the third gate electrodes $TX3_1$, $TX3_2$, and unnecessary charges are collected in the potential well of the third semiconductor region FD3. The detection gate signal $S_1$ and the charge transfer signal $S_{31}$ have opposite phases. The detection gate signal $S_2$ and the charge transfer signal $S_{32}$ have opposite phases.

According to the present modification example, the readout circuits RC can be disposed without degrading the improvement of the aperture ratio and the efficiency of the charge transfer. The regions RE may be located along one of the sides of the pixel regions PA1, PA2 which extend in the column direction. In this case, the regions RE are disposed between the pixel regions PA1, PA2 adjacent in the row direction.

Figure 15:
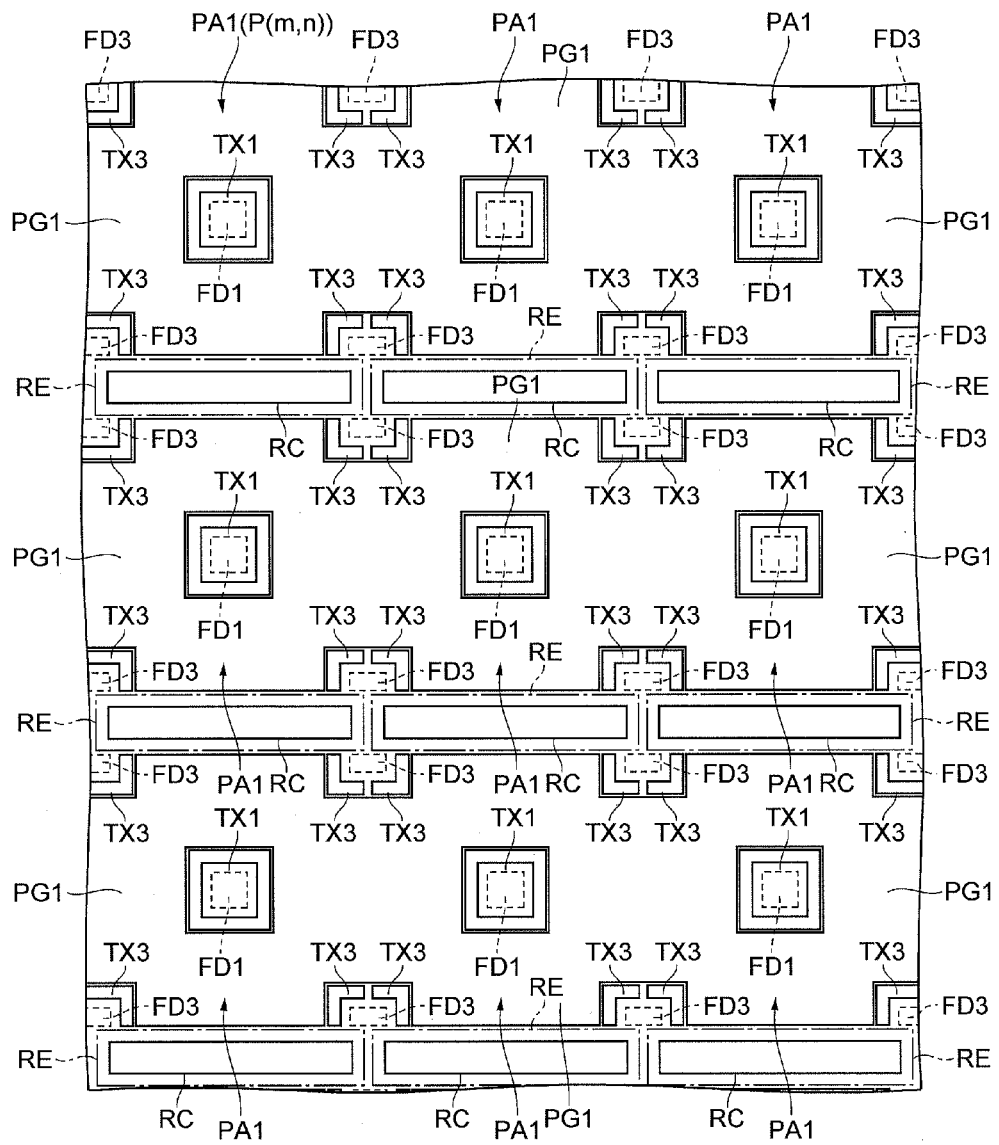
FIG. 15 is a schematic diagram illustrating a configuration of pixels of a range image sensor according to a modification example.

The modification example shown in FIG. 15 is different from the modification example shown in FIG. 11 in that regions RE where readout circuits RC are disposed are set therein. FIG. 15 is a schematic diagram illustrating the configuration of pixels of a range image sensor according to the modification example.

In the present modification example, as with the modification example shown in FIG. 13, the regions RE are located along one of the sides of pixel regions PA1, PA2 which extend in the row direction, and are disposed between the pixel regions PA1, PA2 adjacent in the column direction. The regions RE may be located along one of the sides of the pixel regions PA1, PA2 which extend in the column direction.

Figure 16:
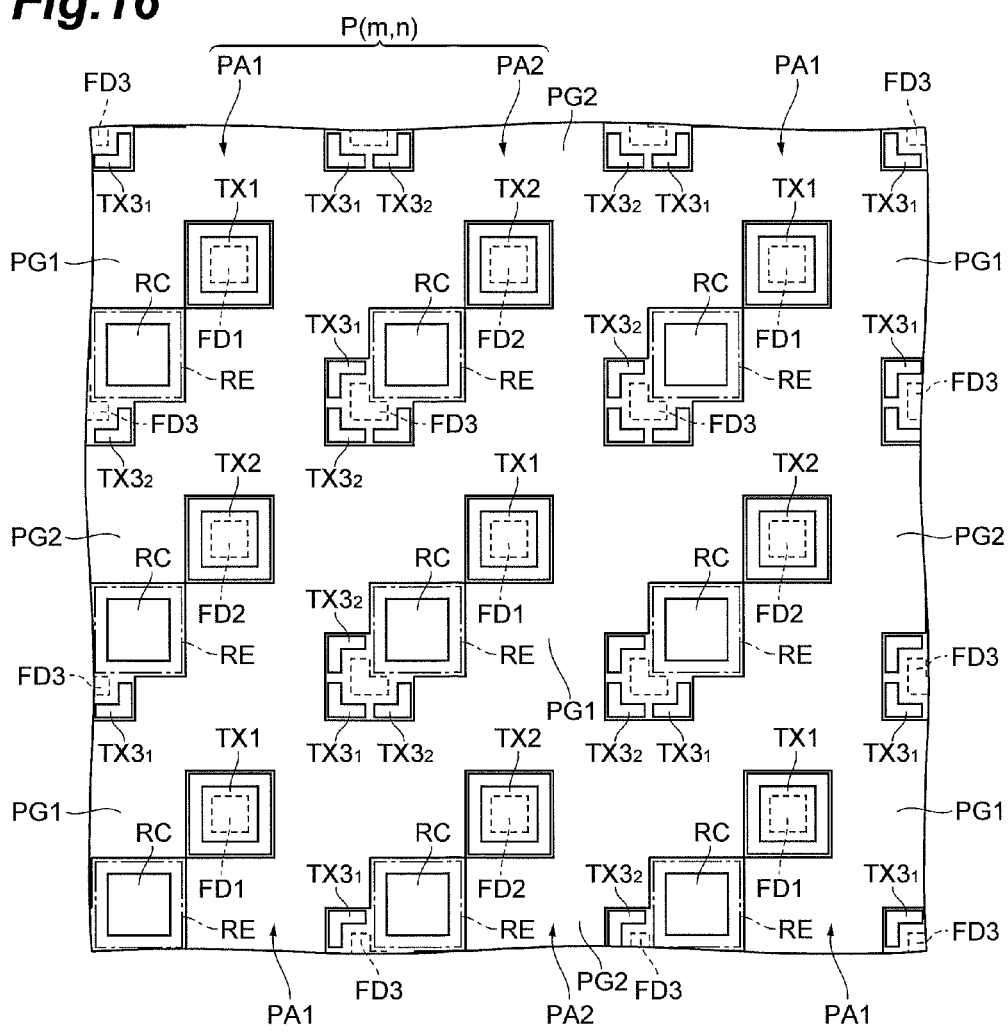
FIG. 16 is a schematic diagram illustrating a configuration of pixels of a range image sensor according to a modification example.

In the modification example of FIG. 16, the locations of the regions RE are different from those in the modification example shown in FIG. 13. FIG. 16 is a schematic diagram illustrating the configuration of pixels of a range image sensor according to the modification example.

The regions RE where readout circuits RC are disposed are located in respective one of corner portions of the pixel regions PA1, PA2. That is, third gate electrodes $TX3_1$, $TX3_2$ and third semiconductor regions FD3 are not disposed in the corner portions where the regions RE are located. The regions RE are located in respective pixel regions PA1, PA2.

According to the present modification example, the readout circuits RC can be also disposed without degrading the improvement of the aperture ratio and the efficiency of the charge transfer. The regions RE may be located in respective another corner portions of the pixel regions PA1, PA2.

Figure 17:
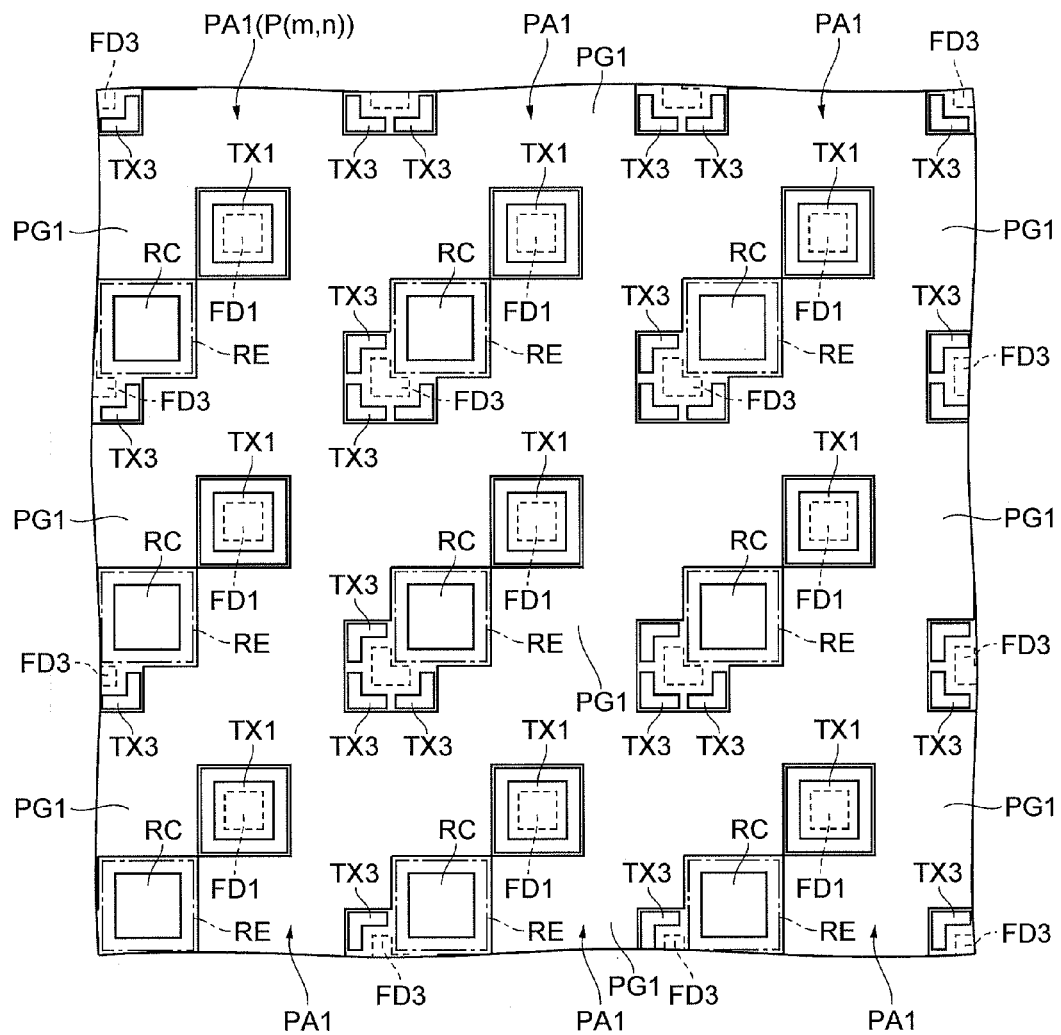
FIG. 17 is a schematic diagram illustrating a configuration of pixels of a range image sensor according to a modification example.

In the modification example shown in FIG. 17, the locations of regions RE are different from those in the modification example shown in FIG. 15. FIG. 17 is a schematic diagram illustrating pixels of a range image sensor according to the modification example.

The regions RE where readout circuits RC are disposed are located in respective one of corner portions of pixel regions PA1, PA2. That is, third gate electrodes $TX3_1$, $TX3_2$ and third semiconductor regions FD3 are not disposed in the corner portions where the regions RE are located. The regions RE are located in respective pixel regions PA1, PA2.

According to the present modification example, the readout circuits RC can be disposed without degrading the improvement of the aperture ratio and the efficiency of the charge transfer. The regions RE may be located in respective another corner portions of the pixel regions PA1, PA2.

The above described the preferred embodiments of the present invention, but it should be noted that the present invention is not always limited to the above embodiments but can be modified in many ways without departing from the scope and spirit of the invention.

The shape of the pixel regions PA1 and PA2 is not limited to a rectangular shape (square shape). The shape of the pixel regions PA1, PA2 may be, for example, a triangular shape or a polygon with five or more vertices.

The range image sensor 1 is not limited to a front-illuminated type range image sensor. The range image sensor 1 may be a back-illuminated type range image sensor.

The charge generating region where charges are generated in response to incident light may be constituted by a photodiode (for example, an implanted photodiode or the like). The range image sensor 1 is not limited to a configuration in which pixels P(m, n) are disposed in a two-dimensional arrangement, but may have a configuration in which pixels P(m, n) are disposed in a one-dimensional arrangement.

The p- and n-type conductions in the range image sensor 1 in accordance with the above-mentioned embodiment are interchangeable.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A range sensor having a plurality of pixel regions, each pixel region comprising:
   a charge generating region configured such that outer peripheries thereof extend to sides of a polygonal pixel region except for corner portions of the pixel region, and configured to generate charges in response to incident light;
   a signal charge collecting region disposed at a center portion of the pixel region and inside the charge generating region so as to be surrounded by the charge generating region, and configured to collect the signal charges from the charge generating region;
   a corner charge collecting region disposed in a corner portion of the pixel region and outside the charge generating region, and configured to collect charges from a peripheral region of the charge generating region;
   a photogate electrode disposed on the charge generating region;
   a transfer electrode disposed between the signal charge collecting region and the charge generating region, and configured to cause the signal charges from the charge generating region to flow into the signal charge collecting region in response to an input signal;
   a corner charge collecting gate electrode disposed between the corner charge collecting region and the charge generating region, and configured to cause charges from the charge generating region to flow into the corner charge collecting region in response to an input signal; and
   a readout circuit for reading out a signal corresponding to a charge quantity accumulated in the signal charge collecting region, the readout circuit located in one corner portion of the pixel region,
   wherein the charge generating regions of the plurality of pixel regions are formed integrally and continuous with each other, and
   wherein the photogate electrodes of the plurality of pixel regions are formed integrally and continuous with each other.

2. The range sensor according to claim 1,
   wherein the corner charge collecting regions of the plurality of pixel regions are integrated with each other.

3. The range sensor according to claim 1,
   wherein the transfer electrodes of the plurality of pixel regions are supplied respective charge transfer signals having different phases.

4. The range sensor according to claim 1,
   wherein the transfer electrode is supplied a transfer signal which is intermittently given a phase shift at a predetermined timing.

5. The range sensor according to claim 1,
   wherein a region is located along one side of the pixel region and outside the pixel region; and
   the region includes a readout circuit for reading out a signal corresponding to a charge quantity accumulated in the signal charge collecting region.

6. The range sensor of claim 1,
   wherein the signal charge collecting region is rectangular-shaped when viewed in a plan view, and
   the transfer electrode has approximately a polygonal shape.

7. A range image sensor comprising an imaging region including a plurality of units disposed in a one-dimensional or two-dimensional arrangement on a semiconductor substrate and which obtains a range image based on charge quantities output from the units,
   wherein each of the units is the range sensor set forth in claim 1.

8. The range sensor according to claim 1, further comprising a light-shielding layer having an opening,
   wherein the opening is located to correspond to the photogate electrodes and has a shape corresponding to the photogate electrodes.

9. The range sensor according to claim 1,
   wherein the charge generating regions of the plurality of pixel regions are continuous with each other in row and column directions, and
   wherein the photogate electrodes of the plurality of pixel regions are continuous with each other in the row and column directions.

* * * * *